United States Patent
Yoshioka et al.

(10) Patent No.: US 8,841,692 B2
(45) Date of Patent: Sep. 23, 2014

(54) LEAD FRAME, ITS MANUFACTURING METHOD, AND SEMICONDUCTOR LIGHT EMITTING DEVICE USING THE SAME

(75) Inventors: Osamu Yoshioka, Tokyo (JP); Hitoshi Motomura, Tokyo (JP); Takehito Tsukamoto, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 12/737,678

(22) Filed: Feb. 4, 2011

(65) Prior Publication Data

US 2011/0133232 A1 Jun. 9, 2011

Related U.S. Application Data

(63) Continuation of application No. PCT/JP2009/068921, filed on Nov. 5, 2009.

(30) Foreign Application Priority Data

| Nov. 7, 2008 | (JP) | 2008-286265 |
| Feb. 27, 2009 | (JP) | 2009-045460 |
| May 19, 2009 | (JP) | 2009-120675 |

(51) Int. Cl.

| H01L 33/62 | (2010.01) |
| H01L 23/00 | (2006.01) |
| H01L 33/60 | (2010.01) |
| H01L 33/48 | (2010.01) |
| H01L 33/64 | (2010.01) |
| H01L 21/48 | (2006.01) |

(52) U.S. Cl.
CPC ....... *H01L 33/62* (2013.01); *H01L 2224/48247* (2013.01); *H01L 33/60* (2013.01); *H01L 2224/45144* (2013.01); *H01L 2224/48091* (2013.01); *H01L 33/486* (2013.01); *H01L 33/642* (2013.01); *H01L 2924/01055* (2013.01); *H01L 24/97* (2013.01); *H01L 21/4828* (2013.01)

USPC ............ 257/99; 257/676; 257/E33.057

(58) Field of Classification Search
CPC ..... H01L 33/62; H01L 33/642; H01L 33/647; H01L 33/486
USPC ............ 257/98–100, 666, 675, 676, 670, 257/E33.057

See application file for complete search history.

(56) References Cited

U.S. PATENT DOCUMENTS

| 7,910,946 B2 * | 3/2011 | Kamada | 257/99 |
| 2002/0079561 A1 | 6/2002 | Yasunaga et al. | |

(Continued)

FOREIGN PATENT DOCUMENTS

| CN | 101060157 | 10/2007 |
| JP | 2002-83918 | 3/2002 |

(Continued)

OTHER PUBLICATIONS

International Search Report for PCT/JP2009/068921, mailed Dec. 8, 2009.

(Continued)

*Primary Examiner* — Yu Chen

(57) ABSTRACT

A lead frame comprises on a same plane, a pad part including an LED chip mounting upper surface A on which at least an LED chip is to be mounted, and a lead part including an electric connection area C in which an electric connection with the LED chip is made. A relationship between an area S1 of the mounting upper surface of the pad part 2 and an area S2 of a radiating lower surface opposite to the mounting upper surface is represented by 0<S1<S2. Side surfaces of the pad part between the mounting upper surface and the radiating lower surface are provided with stepped parts or tapered parts which spread in a direction from the mounting upper surface toward the radiating lower surface and hold a resin-filled during molding.

18 Claims, 11 Drawing Sheets

(56) References Cited

U.S. PATENT DOCUMENTS

| | | | |
|---|---|---|---|
| 2004/0075100 A1* | 4/2004 | Bogner et al. | 257/99 |
| 2006/0180824 A1* | 8/2006 | Kim et al. | 257/99 |
| 2006/0226435 A1* | 10/2006 | Mok et al. | 257/98 |
| 2007/0023893 A1 | 2/2007 | Shin et al. | |

FOREIGN PATENT DOCUMENTS

| | | |
|---|---|---|
| JP | 2004-521506 | 7/2004 |
| JP | 2007-43155 | 2/2007 |
| WO | WO 2007069399 A1 * | 6/2007 |

OTHER PUBLICATIONS

Korean Office Action issued Jul. 10, 2012 in corresponding Korean Patent Application No. 10-2010-7029799.

Chinese Office Action mailed Feb. 13, 2012 issued in corresponding Chinese Patent Application No. 200980124973.3.

English Translation of the International Preliminary Report on Patentability mailed Jun. 21, 2011 for corresponding International Application No. PCT/JP2009/068921.

\* cited by examiner

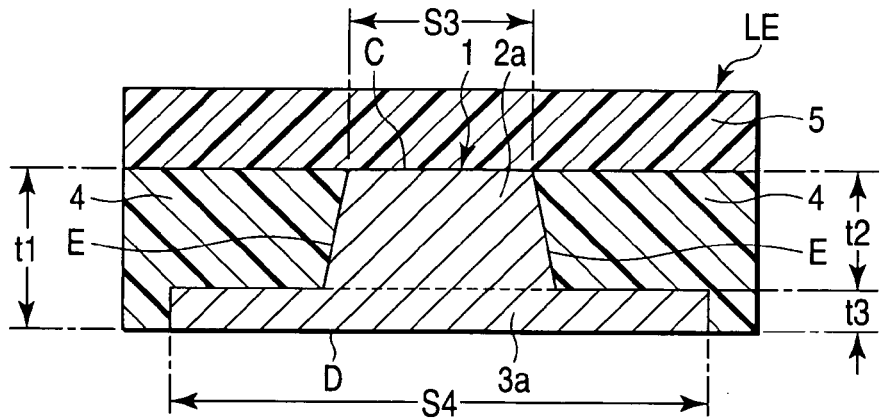
F I G. 4
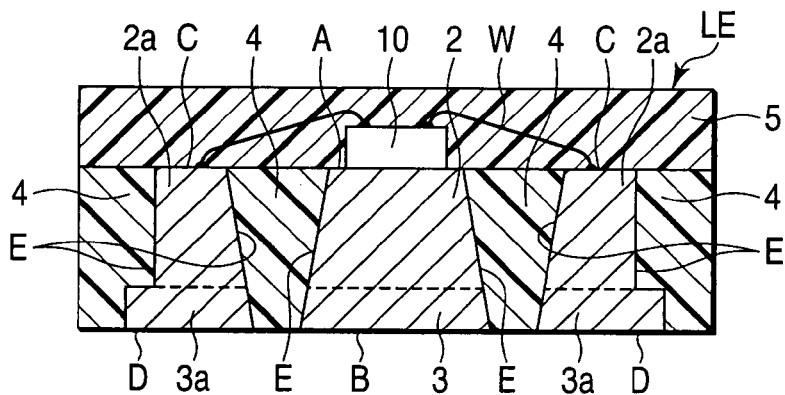
F I G. 5
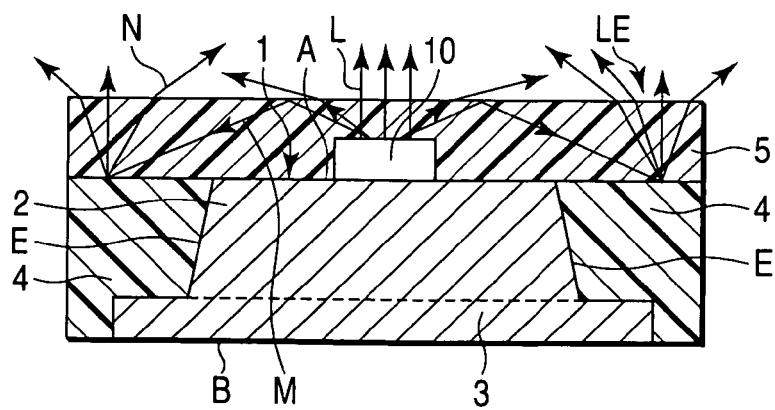
F I G. 6

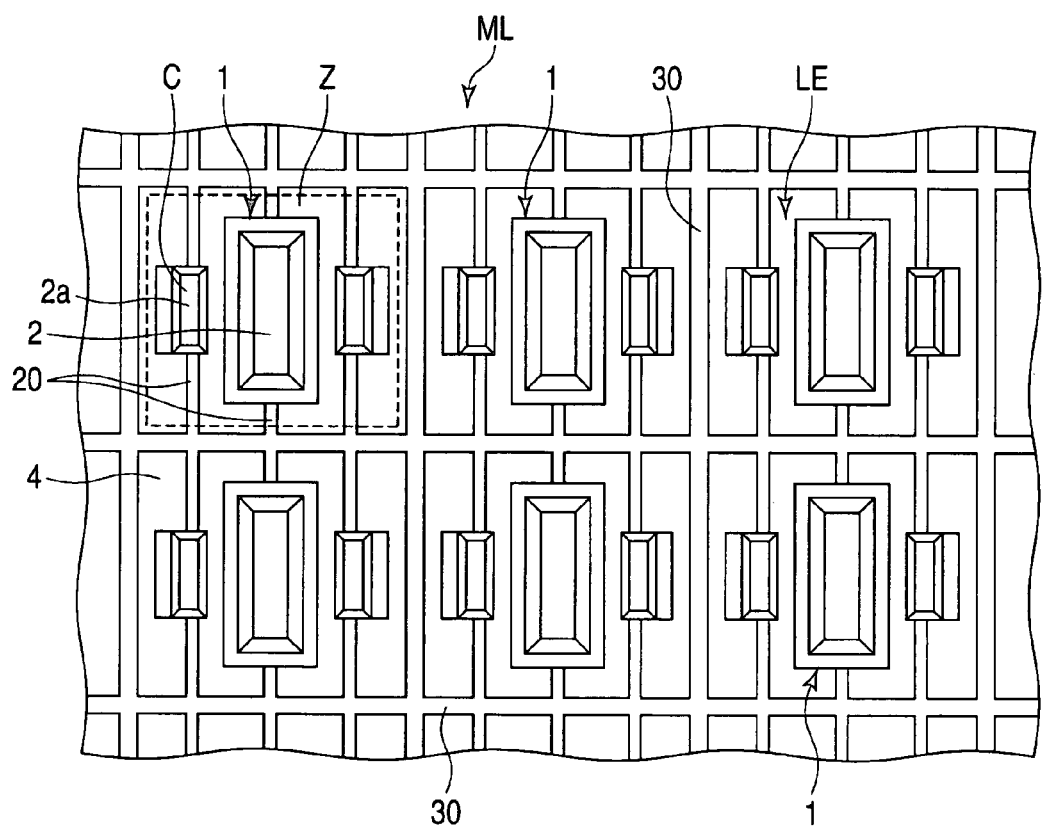
F I G. 10

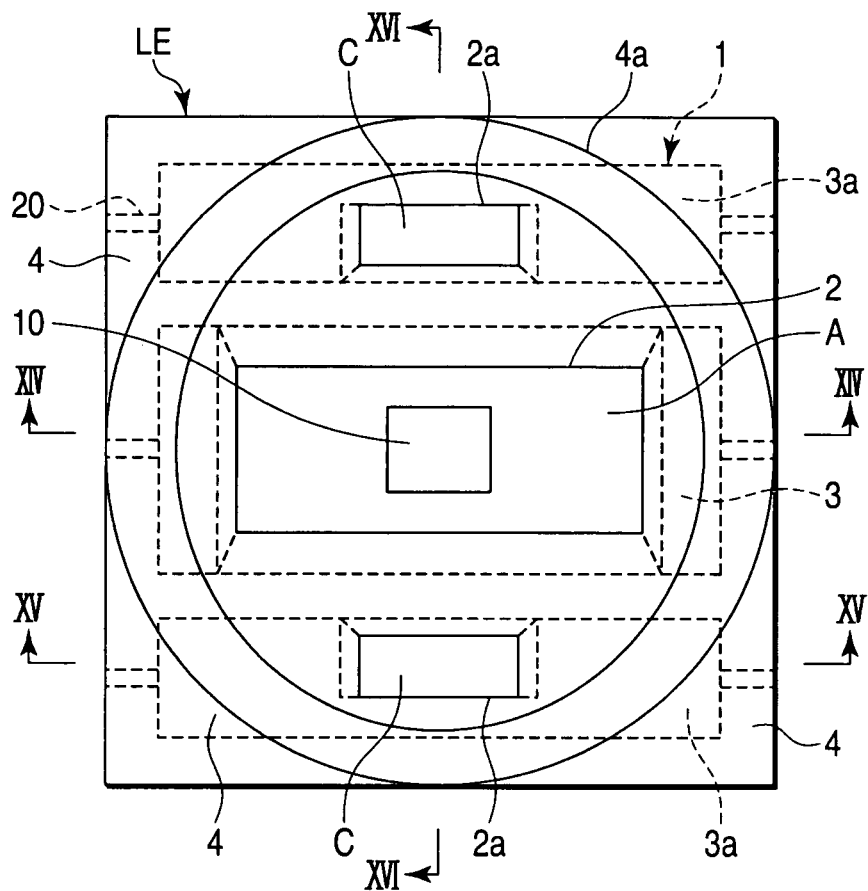
F I G. 13
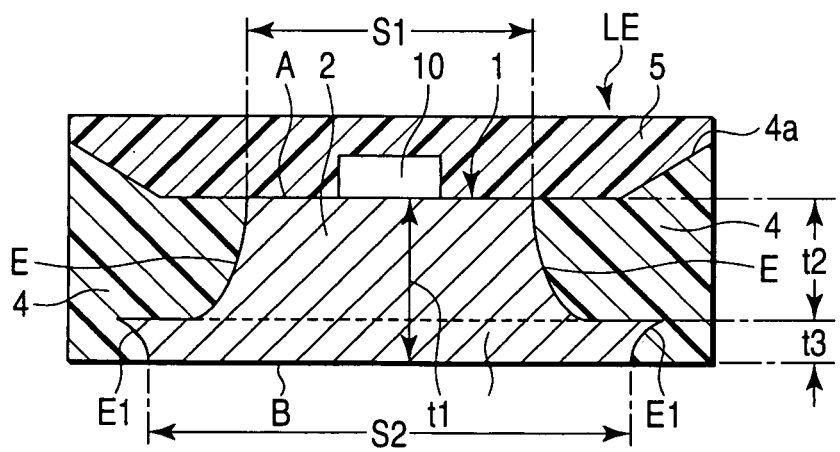
F I G. 14

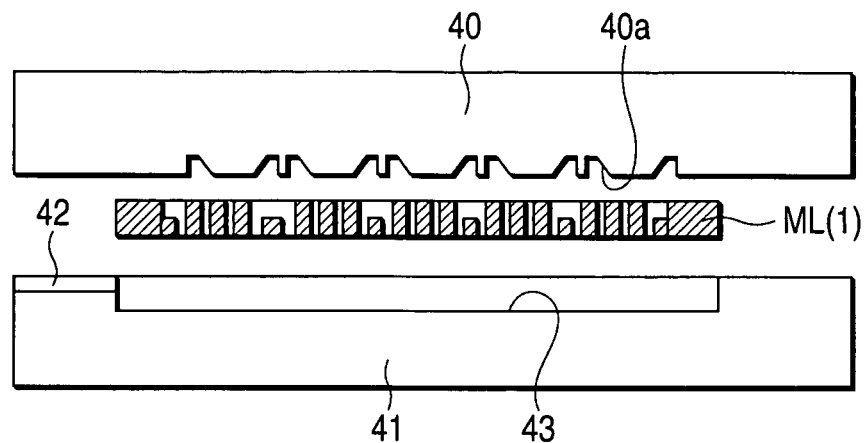
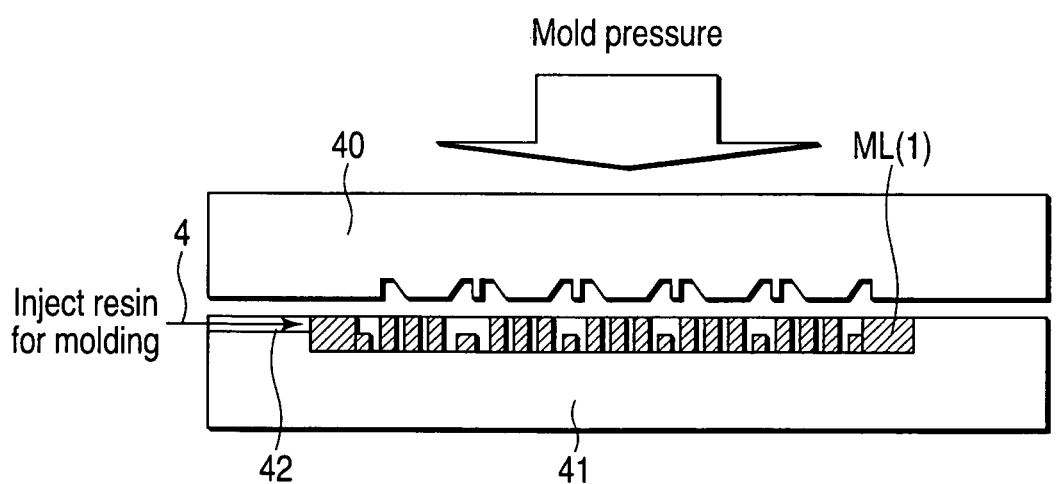
F I G. 17

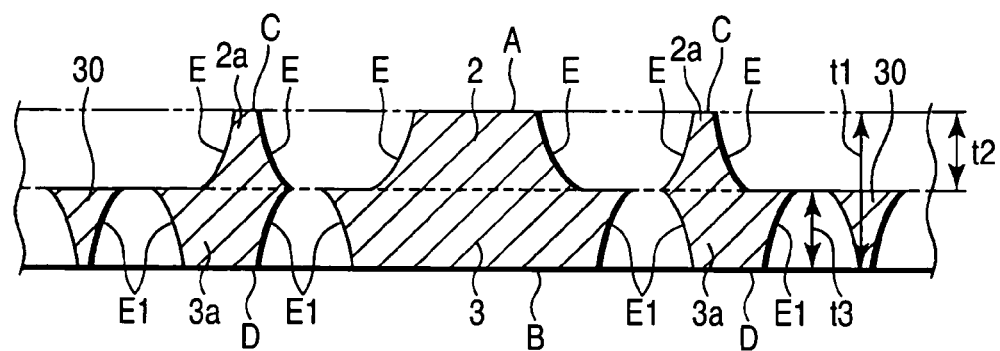
F I G. 20A
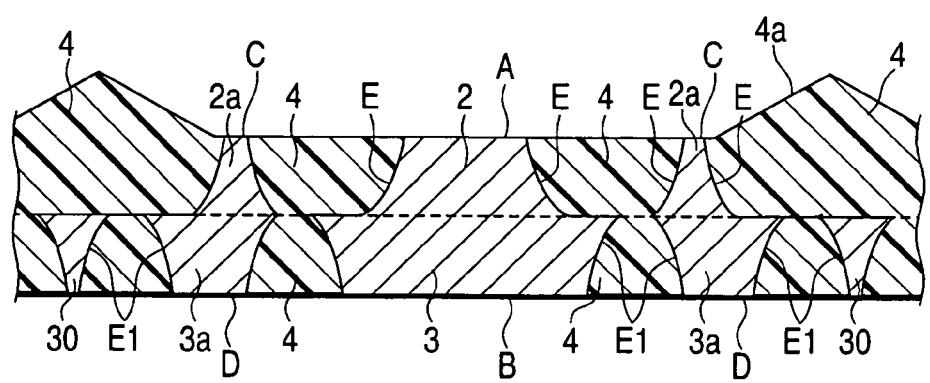
F I G. 20B

LEAD FRAME, ITS MANUFACTURING METHOD, AND SEMICONDUCTOR LIGHT EMITTING DEVICE USING THE SAME

CROSS REFERENCE TO RELATED APPLICATIONS

This is a Continuation Application of PCT Application No. PCT/JP2009/068921, filed Nov. 5, 2009, which was published under PCT Article 21(2) in Japanese.

This application is based upon and claims the benefit of priority from prior Japanese Patent Applications No. 2008-286265, filed Nov. 7, 2008; No. 2009-045460, filed Feb. 27, 2009; and No. 2009-120675, filed May 19, 2009, the entire contents of all of which are incorporated herein by reference.

BACKGROUND OF THE INVENTION

1. Field of the Invention

The present invention relates to a lead frame having an LED (Light Emitting Diode) carried and mounted thereon, its manufacturing method, and a semiconductor light emitting device using the same.

2. Description of the Related Art

Generally, a lead frame having an electronic device such as a semiconductor integrated circuit or an LED device carried and mounted thereon is manufactured of a lead frame metal thin plate made of copper thin plate, iron/nickel alloy thin plate, copper/nickel/tin alloy thin plate or the like. Specifically, the lead frame is manufactured by using an etchant such as ferric chloride from either side or both sides of a metal material for photoetching. Alternatively, the lead frame is manufactured by punching using a press mold. The lead frame comprises a pad (island part) configured to mount a semiconductor integrated circuit or LED device thereon, an inner lead and an outer lead which are insulated and separated from the pad. The inner lead is electrically connected to an electronic device. The outer lead is electrically connected to the outside and extends from the inner lead.

The lead frame includes a mounting part (mounting surface) configured to mount an electronic device on the upper surface of the pad. Further, there has been known a lead frame including a radiator (heat radiating plate) configured to radiate drive heat generated from a body of an electronic device such as LED device on the lower surface of the pad or heat due to environmental conditions around the electronic device. In other words, the lead frame is configured such that the heat is radiated from the radiator on the lower surface of the pad or the outer lead to the outside so as to prevent the heat from being accumulated in the electronic device.

A substrate configured to mount electronic devices such as a semiconductor integrated circuit or an LED device employs a ceramic substrate, a printed circuit board or the like in addition to the lead frame substrate using a lead frame made of metal thin plate. However, the radiator formed on the pad on which the electronic device is mounted is desired to be as wide as possible in its radiating area in terms of heat radiating efficiency. Patent Literatures 1 to 5 describe therein techniques for mounting an electronic light emitting device such as LED on a carrier and heat radiating techniques for preventing heat from being accumulated in a light emitting device.

PATENT LITERATURES

Patent Literature 1: Jpn. Pat. Appln. KOKAI Publication No. 2003-8071

Patent Literature 2: Jpn. Pat. Appln. KOKAI Publication No. 2003-347600

Patent Literature 3: Jpn. Pat. Appln. KOKAI Publication No. 2004-172160

Patent Literature 4: Jpn. Pat. Appln. KOKAI Publication No. 2007-220925

Patent Literature 5: Jpn. Pat. Appln. KOKAI Publication No. 2008-227166

BRIEF SUMMARY OF THE INVENTION

When a ceramic substrate is used as a device carrying substrate having an LED device carried and mounted thereon, for example, its heat radiating property is preferable and its reliability is also excellent but it has a disadvantage that its cost is high. When a printed circuit board is used as the device carrying substrate, it has a disadvantage that an epoxy resin used as a base material of the printed circuit board is not excellent in heat radiating property. A printed circuit board having a metal plate made of Cu (copper) or Al (aluminum) inserted in the inner layer of the board has to be employed to eliminate the disadvantage. Further, in order to reflect a light emitted from the LED device at a high light reflectivity and to secure a high optical gain, there was needed a step of applying an optically-reflective ceramic ink on a light reflecting surface of the substrate having a light emitting diode mounted thereon.

When a lead frame substrate made of metal thin plate is used as a device carrying substrate having an LED device carried and mounted thereon, it has a disadvantage that a heat radiating property is poor, and there is a need to secure a high optical gain (high light reflectivity in the light irradiating direction) of the LED device. Thus, there is a need to stack a composite material made of special composite resin (ceramic ink and Si resin) on the light reflecting surface of the lead frame substrate mounting the light emitting diode thereon and thereby to compensate for the disadvantage. There has been a disadvantage that although the lead frame substrate system is employed, a satisfactory heat radiation for the mounting substrate surface from the LED device cannot be secured, which leads to an insufficient heat radiating property.

The printed circuit board or the lead frame substrate other than the ceramic substrate is poor in heat radiating property and has a disadvantage that its manufacturing method or steps are more complicated than a method for manufacturing a semiconductor light emitting device using a ceramic substrate.

The present invention has been made in view of the above problems, and it is an object of the invention to provide a light emitting diode lead frame substrate having both high heat radiating property and high optical gain as a device carrying substrate carrying and mounting an LED device (LED chip) thereon, its manufacturing method, and a semiconductor light emitting device using the same at low cost.

A first aspect of the invention is a lead frame comprising, on a same plane, pad part 2 including an LED chip mounting upper surface A on which at least an LED chip 10 is to be mounted, and a lead part 2a including an electric connection area C in which an electric connection with the LED chip is made, wherein a relationship between an area S1 of the mounting upper surface A of the pad part 2 and an area S2 of a radiating lower surface B opposite to the mounting upper surface A is represented by 0<S1<S2, and side surfaces of the pad part 2 between the mounting upper surface A and the radiating lower surface B are provided with stepped parts or tapered parts E which spread in a direction from the mounting upper surface A toward the radiating lower surface B and hold a resin-filled during molding.

A second aspect of the invention is the lead frame according to the first aspect, wherein a relationship between an area S3 of the electric connection area C of the lead part 2a and an area S4 of a radiating lower surface D opposite to the electric connection area C and in plane with the radiating lower surface B of the pad part 2 is represented by 0<S3<S4, and side surfaces of the lead part 2a between the electric connection area C and the radiating lower surface D are provided with stepped parts or tapered parts E which spread in a direction from the electric connection area C toward the radiating lower surface D and hold a resin-filled during molding.

A third aspect of the invention is a lead frame comprising, on a same plane, a pad part 2 including an LED chip mounting upper surface A on which at least an LED chip 10 is to be mounted, and a lead part 2a including an electric connection area C in which an electric connection with the LED chip is made, wherein a relationship between an area S1 of the mounting upper surface A of the pad part 2 and an area S2 of a radiating lower surface B opposite to the mounting upper surface A is represented by 0<S1<S2, the pad part 2 is formed of a first upper structure including the mounting upper surface A and a first lower, structure integrated with the first upper structure and including the radiating lower surface B, side surfaces of the first upper structure are provided with stepped parts or tapered parts E which spread in a direction from the mounting upper surface A toward the radiating lower surface B and hold a resin-filled during molding, and side surfaces of the first lower structure are provided with stepped parts or tapered parts E1 which spread in a direction from the radiating lower surface B toward the mounting upper surface A and hold a resin-filled during molding.

A fourth aspect of the invention is the lead frame according to the third aspect, wherein a relationship between an area S3 of the electric connection area C of the lead part 2a and an area S4 of a radiating lower surface D opposite to the electric connection area C and in plane with the radiating lower surface B of the pad part 2 is represented by 0<S3<S4, the lead part 2a is formed of a second upper structure including the electric connection area C and a second lower structure integrated with the second upper structure and including the radiating lower surface D, side surfaces of the second upper structure are provided with stepped parts or tapered parts E which spread in a direction from the electric connection area C towards the radiating lower surface D and hold a resin-filled during molding, and side surfaces of the second lower structure are provided with stepped parts or tapered parts E1 which spread in a direction from the radiating lower surface D toward the electric connection area C and hold a resin-filled during molding.

A fifth aspect of the invention is the lead frame according to the first aspect, wherein the pad part 2 and the lead part 2a of which both an upper surface and a lower surface are in a same plane form a unit frame, the each unit frame mutually connected via one or a plurality of tie bars and arranged in longitudinal and horizontal directions, and an upper surface of each of the tie bars is lower than that of the pad part 2 and the lead part 2a, or a lower surface of each of the tie bars is higher than that of the pad part 2 and the lead part 2a, and each of the tie bars is set to be smaller in thickness than the pad part 2 and the lead part 2a.

A sixth aspect of the invention is a method of manufacturing lead frame comprising: forming a photoresist pattern configured to form a mounting upper surface A including an area S1 of a pad part 2 on a upper surface of a plate-shaped lead frame metal material; forming a photoresist pattern configured to form a radiating lower surface B including an area S2 opposite to the mounting upper surface A of the pad part 2 on a lower surface of the metal material, and etching the metal material from both upper and lower surfaces to form stepped parts or tapered parts, which spread in a direction from the mounting upper surface A toward the radiating lower surface B and hold a resin-filled during molding, on side surfaces of the pad between the mounting upper surface A and the radiating lower surface B for which a relationship between the area S1 of the mounting upper surface A of the pad part 2 and the area S2 of the radiating lower surface B is represented by 0<S1<S2.

A seventh aspect of the invention is the method according to the sixth aspect, comprising: forming a photoresist pattern configured to form an electric connection area C including an area S3 of a lead part 2a on the upper surface of the metal material when a photoresist pattern configured to form the mounting upper surface A is formed; forming a photoresist pattern configured to form a radiating lower surface D including an area S4 opposite to the electric connection area C of the lead part 2a on the lower surface of the metal material when a photoresist pattern configured to form the radiating lower surface B is formed; and etching the metal material from both upper and lower surfaces to form stepped parts or tapered parts E, which spread in a direction from the electric connection area C toward the radiating lower surface D and hold a resin-filled during molding, on side surfaces of the lead part 2a between the electric connection area C and the radiating lower surface D for which a relationship between the area S3 of the electric connection area C of the lead part 2a and the area S4 of the radiating lower surface C is represented by 0<S3<S4.

An eighth aspect of the invention is a method of manufacturing lead frame comprising: forming a photoresist pattern configured to form a mounting upper surface A including an area S1 of a pad part 2 on the upper surface of a lead frame metal material; forming a photoresist pattern configured to form a radiating lower surface B including an area S2 opposite to the mounting upper surface A of the pad part 2 on the lower surface of the metal material; and etching the metal material from both upper and lower surfaces to form stepped parts or tapered parts E for which a relationship between the area S1 of the mounting upper surface A of the pad part 2 and the area S2 of the radiating lower surface B is represented by 0<S1<S2 and the pad 2 is formed of an first upper structure including the mounting upper surface A and a first lower structure integrated with the first upper structure and including the radiating lower surface B, and which spread in a direction from the mounting upper surface A toward the radiating lower surface B on side surfaces of the first upper structure and hold a resin-filled during molding, and to form a stepped sections or tapered sections E1 which spread in a direction from the radiating lower surface B toward the mounting upper surface A on side surfaces of the first lower structure and hold a resin-filled during molding.

A ninth aspect of the invention is the method according to the eighth aspect, comprising: forming a photoresist pattern configured to form an electric connection area C including an area S3 of a lead part 2a on the surface of the metal material when a photoresist pattern configured to form the mounting upper surface A is formed; forming a photoresist patter configured to form a radiating lower surface D including an area S4 opposite to the electric connection area C of the lead part 2a on the lower surface of the metal material when a photoresist pattern configured to form the radiating lower surface B is formed; and etching the metal material from both surfaces to form stepped parts or tapered parts E for which a relationship between the area S3 of the electric connection area C of the lead 2a and the area S4 of the radiating lower surface D is represented by S3<S4 and the lead 2a is formed of an second upper structure including the electric connection area C and a second lower structure integrated with the second upper structure and including the radiating lower surface D and which spread in a direction from the electric connection area C toward the radiating lower surface D on side surfaces of the second upper structure and hold a resin-filled during molding, and to form a stepped parts or tapered parts E1 which spread in a direction from the radiating lower surface D toward the electric connection area C on side surfaces of the lower structure and hold a resin-filled during molding.

A tenth aspect of the invention is the method according to the sixth aspect, wherein the pad part 2 and the lead part 2a of which both an upper surface and a lower surface are in a same plane form a unit frame, the each unit frame mutually connected via one or a plurality of tie bars and arranged in longitudinal and horizontal directions, and an upper surface of each of the tie bars is lower than that of the pad part 2 and the lead part 2a, or a lower surface of each of the tie bars is higher than that of the pad part 2 and the lead part 2a, and each of the tie bars is set to be smaller in thickness than the pad part 2 and the lead part 2a.

An eleventh aspect of the invention is a semiconductor light emitting device in which a lead frame comprising, in a same plane, a pad part 2 including an LED chip mounting upper surface A on which at least an IC chip such as an LED chip 10 is mounted; and a lead part 2a including an electric connection area C in which an electric connection with the LED chip is made, the lead frame molded with a resin-filled in a thickness direction from the mounting upper surface A toward a radiating lower surface B opposite to the mounting upper surface A, and a transparent resin covering the mounting upper surface A of the pad part 2 while including the LED chip and the electric connection area C, wherein a relationship between an area S1 of the mounting upper surface A of the pad part 2 and an area S2 of the radiating lower surface B is represented by 0<S1<S2, side surfaces of the pad part 2 between the mounting upper surface A and the radiating lower surface B are provided with stepped parts or tapered parts E which spread in a direction from the mounting upper surface A toward the radiating lower surface B, and the resin-filled is held in the stepped parts or tapered parts E.

A twelfth aspect of the invention is a semiconductor light emitting device in which a lead frame comprising: in a same plane, a pad part 2 including an LED chip mounting upper surface A on which at least an IC chip such as an LED chip 10 is mounted; and a lead part 2a including an electric connection area C in which an electric connection with the LED chip is made, the lead frame molded with a resin-filled in a thickness direction from the mounting upper surface A toward a radiating lower surface B opposite to the mounting upper surface A, and a transparent resin covering the mounting upper surface A of the pad part 2 while including the LED chip and the electric connection area C, wherein a relationship between an area S1 of the mounting upper surface A of the pad part 2 and an area S2 of the radiating lower surface B is represented by 0<S1<S2, the pad is formed of an upper structure including the mounting upper surface A and a lower structure integrated with the upper structure and including the radiating lower surface, side surfaces of the upper structure are provided with stepped parts or tapered parts E from the mounting upper surface A toward the radiating lower surface B, side surfaces of the lower structure are provided with stepped parts or tapered parts E1 from the radiating lower surface B toward the mounting upper surface A, and the resin-filled is held in the stepped parts or tapered parts E and E1.

A thirteenth aspect of the invention is the device according to the eleventh aspect, wherein a relationship between an area S3 of the electric connection area C of the lead part 2a and an area S4 of a radiating lower surface D opposite to the electric connection area C and in plane with the radiating lower surface B of the pad part 2 is represented by 0<S3<S4, side surfaces of the lead part 2a between the electric connection area C and the radiating lower surface D are provided with stepped parts or tapered parts E which spread in a direction from the electric connection area C toward the radiating lower surface D and hold the resin-filled, and the resin-filled is held in the stepped parts or tapered parts E.

A fourteenth aspect of the invention is the device according to the eleventh aspect, wherein a relationship between an area S3 of the electric connection area C of the lead part 2a and an area S4 of a radiating lower surface D opposite to the electric connection area C and in plane with the radiating lower surface B of the pad part 2 is represented by 0<S3<S4, the lead part 2a is formed of an upper structure including the electric connection area C and a lower structure integrated with the upper structure and including the radiating lower surface D, side surfaces of the upper structure are provided with stepped parts or tapered parts E which spread in a direction from the electric connection area C toward the radiating lower surface D and hold a resin-filled during resin molding, side surfaces of the lower structure are provided with stepped parts or tapered parts E1 which spread in a direction from the radiating lower surface D toward the electric connection area C and hold a resin-filled during resin molding, and the resin-filled is held in the stepped parts or tapered parts E and E1.

A fifteenth aspect of the invention is the device according to the eleventh aspect, wherein a relationship between an optical refraction index n1 of the resin-filled and an optical refraction index n2 of the transparent resin is set at n1>n2 and the resin-filled has a high reflectivity.

A sixteenth aspect of the invention is the device according to the eleventh aspect, wherein the resin-filled is added with a particulate for improving a reflecting property.

A seventeenth aspect of the invention is a lead frame comprising: structures in which an upper structure on the upper surface and a lower structure on the lower surface are integrated together, the structures separated from each other; a resin-filled formed between and outside the structures and having the same thickness as the structures, the upper structure including a pad part 2 and a lead part 2a separated from the pad part 2, the lower structure including a radiator 3 integrated with the pad part 2 and a radiator 3a integrated with the lead part 2a, a relationship between an area S1 of the surface of the pad part 2 and an area S2 of the lower surface of the radiator 3 represented by 0<S1<S2, a relationship between an area S3 of the surface of the lead part 2a and an area S4 of the lower surface of the radiator 3a represented by 0<S3<S4, side surfaces of the each upper structure provided with stepped parts or tapered parts which spread in a direction from the upper surface of the structures toward the lower surface thereof, and side surfaces of the each lower structure provided with stepped parts or tapered parts which spread in a direction from the lower surface of the lead frame toward the surface thereof; and a light reflecting ring 4a formed on the upper surface and outside the pad part 2 and the lead part 2a, the light reflecting ring 4a comprising an inner periphery surface tilted to the pad part 2, and the light reflecting ring 4a integrally formed with the resin-filled and projecting from the resin-filled.

An eighteenth aspect of the invention is the lead frame according to the seventeenth aspect, wherein a tilt angle of the inner periphery surface of the light reflecting ring 4a relative to the upper surface of the pad part 2 is between 30 degrees and 85 degrees.

A nineteenth aspect of the invention is the lead frame according to the seventeenth aspect, wherein the resin-filled is a light diffusing resin mixed with a powdery additive and has an optical refraction index of 2 or more.

A twentieth aspect of the invention is the lead frame according to the seventeenth aspect wherein the pad part 2 and the lead part 2a of which both an upper surface and a lower surface are in a same plane form unit frame, the each unit frame mutually connected via one or a plurality of tie bars and arranged in longitudinal and horizontal directions, and an upper surface of each of the tie bars is lower than that of the pad part 2 and the lead part 2a, or a lower surface of each of the tie bars is higher than that of the pad part 2 and the lead part 2a, and each of the tie bars is set to be smaller in thickness than the pad part 2 and the lead part 2a.

A twenty-first aspect of the invention is a method of manufacturing lead frame comprising: forming photoresist patterns configured to form a chip mounting upper surface A including an area S1 of a pad part 2 and an electric connection area C including an area S3 of a lead part 2a on a surface of a lead frame metal material; forming photoresist patterns configured to form a radiating lower surface B including an area S2 opposite to the chip mounting upper surface A and a radiating lower surface D including an area S4 opposite to the electric connection area C on a lower surface of the metal material; etching the metal material from both surfaces to form an integrated structure including an upper structure and a lower structure made of the metal material for which a relationship between the area S1 of the chip mounting upper surface A of the pad part 2 and the area S2 of the radiating lower surface B is set at 0<S1<S2 and a relationship between the area S3 of the electric connection area C and the area S4 of the radiating lower surface D is set at 0<S3<S4, to form stepped parts or tapered parts E which spread in a direction from the chip mounting upper surface A toward the radiating lower surface B on side surfaces of the upper structure, to form stepped parts or tapered parts E1 which spread in a direction from the radiating lower surface B toward the chip mounting upper surface A on side surfaces of the lower structure, to integrally form the pad part 2 including the chip mounting upper surface A in the upper structure and a radiator 3 including the radiating lower surface B in the lower structure, and to integrally form the lead part 2a including the electric connection area C in the upper structure and a radiator 3a including the radiating lower surface D in the lower structure; providing an integrated structure including the upper structure and the lower structure in a mold for molding; and filling and molding a resin in the mold to form a resin-filled having the same thickness as the integrated structure including the upper structure and the lower structure around the integrated structure including the upper structure and the lower structure, and to form a light reflecting ring 4a for light reflection including an inner periphery surface tilted to the chip mounting upper surface A at side of the mounting upper surface A and outside the pad part 2 and the lead part 2a, at the same time as the formation of the resin-filled so as to form the light reflecting ring 4a to be integral with the resin-filled and be projected from the resin-filled.

A twenty-second aspect of the invention is the method according to the twenty-first aspect, wherein the pad part 2 and the lead part 2a of which both an upper surface and a lower surface are in a same plane form unit frame, the each unit frame mutually connected via one or a plurality of tie bars and arranged in longitudinal and horizontal directions, and an upper surface of each of the tie bars is lower than that of the pad part 2 and the lead part 2a, or a lower surface of each of the tie bars is higher than that of the pad part 2 and the lead part 2a, and each of the tie bars is set to be smaller in thickness than the pad part 2 and the lead part 2a.

A twenty-third aspect of the invention is a semiconductor light emitting device comprising: a lead frame including structures in which an upper structure on a upper surface and a lower structure on a lower surface are integrated, structures separated from one another; a resin-filled which is formed between and outside the structures of the lead frame and has the same thickness as the lead frame, the upper structure including a pad part 2, and a lead part 2a separated from the pad part 2, the lower structure including a radiator 3 integrated with the pad part 2 and a radiator 3a integrated with the lead part 2a, side surfaces of the each upper structure provided with stepped parts or tapered parts which spread in a direction from the surface of the lead frame toward the lower surface thereof, side surfaces of the each lower structure provided with stepped parts or tapered parts which spread in a direction from the lower surface of the lead frame toward the surface thereof; and a light reflecting ring 4a for light reflection on the upper surface and outside the pad part 2 and the lead part 2a, the light reflecting ring 4a including an inner periphery surface tilted relative to the pad part, integrally formed with the resin-filled, and projecting from the resin-filled, an LED chip is mounted on the surface of the pad part 2, an electrode of the LED chip is electrically connected to the lead part 2a, and a transparent resin which covers the LED chip and contacts the inner periphery surface of the light reflecting ring 4a is formed.

A twenty-fourth aspect of the invention is the device according to the twenty-third aspect of the invention, wherein a relationship between an area S1 of the surface of the pad part 2 and an area S2 of the lower surface of the radiator 3 is represented by 0<S1<S2, and a relationship between an area S3 of the surface of the lead part 2a and an area S4 of the lower surface of the radiator 3a is represented by 0<S3<S4.

A twenty-fifth aspect of the invention is the device according to the twenty-third aspect of the invention, wherein the resin-filled is a light diffusing resin in which a powdery additive is mixed into a resin, and has an optical refraction index of 2 or more, which is higher than a refraction index of the transparent resin.

According to the present invention, the relationship between the area S1 of the LED chip mounting upper surface A of the pad part 2 in the semiconductor light emitting device lead frame and the area S2 of the radiating lower surface B opposite to the mounting upper surface A is set at 0<S1<S2, the relationship between the area S3 of the electric connection area C and the area S4 of the radiating lower surface D opposite to the electric connection area C is set at 0<S3<S4, the radiating lower surface B is larger in area than the mounting upper surface A, and the radiating lower surface D is larger in area than the electric connection area C. Thus, a high radiating property can be obtained on the lead frame lower surface.

The stepped part or tapered part is formed to hold the resin-filled during the resin molding on the upper surface or both upper and lower surfaces of the LED lead frame. Thus, reliable adhesion between the lead frame and the resin-filled molded around the lead frame for fixing the lead frame can be obtained, and the separation between the lead frame and the resin-filled or the release of the resin-filled from the lead frame can be prevented thereby improving the reliable anti-release property.

Further, according to the present invention, the resin having a high reflectivity is used for the resin-filled so that the resin-filled or its surface has the high reflectivity, and thus the light emitted from the LED chip 10 can be efficiently discharged to the outside. For the light emitting diode, the relationship between the optical refraction index n1 of the resin-filled and the optical refraction index n2 of the transparent resin formed to cover the LED device is set at n1>n2 so that the reflectivity at the interface between the resin-filled 4 and the transparent resin 5 can be increased, thereby obtaining the high reflectivity at the resin-filled or its surface.

In the present invention, the mold on which the concave part for the light reflecting ring is formed part is used to mold the resin-filled, thereby forming the light reflecting ring integrally formed with the resin-filled. When the light reflecting ring is formed on the resin-filled with separating from the resin-filled, the joint face between the resin-filled and the light reflecting ring is the interface, and when a joint strength therebetween is weak at the interface, the light reflecting ring is easily released from the resin-filled. Particularly, the release easily occurs when water vapor occurring from the resin-filled or the light reflecting ring diffuses at the interface or water vapor in the ambient atmosphere diffuses at the interface. However, the present invention is configured to include the resin-filled and the light reflecting ring integrally formed. Thus, no interface is present between the light reflecting ring and the resin-filled and both are fixedly connected together to have high adhesion. Therefore, the easy release caused by the diffused water vapor at the interface is eliminated, thereby obtaining the light reflecting ring having high connection reliability.

Furthermore, according to the present invention, the resin having a high reflectivity is used for the resin-filled and the light reflecting ring integrated with the resin-filled, and the optical refraction index of the resin-filled and the light reflecting ring integrated with the resin-filled is set to be larger than the optical refraction index of the transparent resin covering the light emitting diode. Thus, the reflectivity at the interface between the resin-filled, the light reflecting ring and the transparent resin can be increased. Therefore, the high reflectivity can be obtained at the resin-filled and the light reflecting ring or its surface, thereby efficiently reflecting the light emitted from the light emitting diode (LED chip) and discharging the light to the outside.

BRIEF DESCRIPTION OF THE SEVERAL VIEWS OF THE DRAWINGS

FIG. 4 is a cross-section view along IV-IV line of FIG. 1.

FIG. 5 is a cross-section view along V-V line of FIG. 1.

FIG. 6 is a schematic cross-section view for explaining a function of a resin-filled of an LED device according to the first embodiment of the present invention.

FIG. 10 is an upper view for explaining a multi-faced lead frame (multiple unit lead frames) connected via a tie bar according to a third embodiment of the present invention.

FIG. 13 is an upper view of a semiconductor light emitting device manufactured using a lead frame according to a fourth embodiment of the present invention.

FIG. 14 is a cross-section view along XIV-XIV line of FIG. 13 showing the semiconductor light emitting device manufactured using the lead frame according to the fourth embodiment of the present invention.

FIG. 17 is a cross-section view of one example of a molding of resin in a lead frame by using a mold.

FIG. 20A is a cross-section view of FIG. 19 in an enlarged manner before a molding process.

FIG. 20B is a cross-section view of FIG. 19 in an enlarged manner.

DETAILED DESCRIPTION OF THE INVENTION

First Embodiment

First, a first embodiment of the present invention will be described below with reference to FIGS. 1, 2, 3, 4 and 5.

Figure 3:
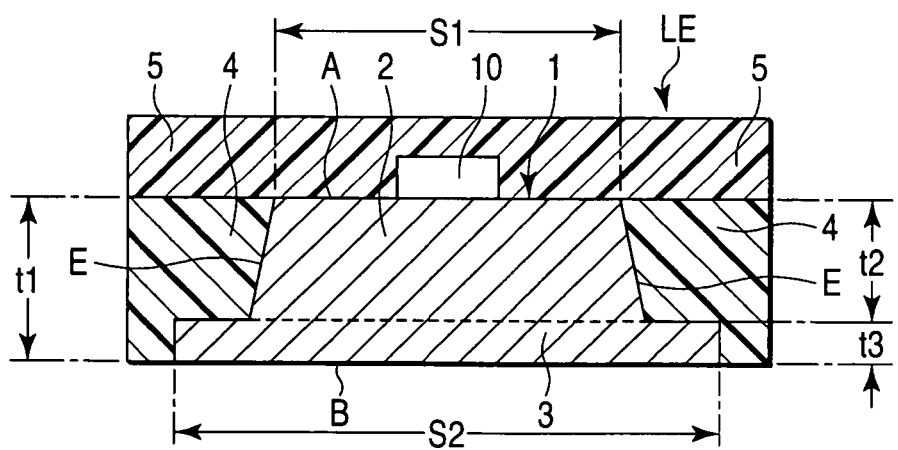
FIG. 3 is a cross-section view along line of FIG. 1.

A lead frame 1 according to the present embodiment is formed by punching a base material having a metallic plate shape through a press mold. In other words, as shown in FIGS. 3 and 5, the lead frame 1 is formed by punching the base material having a metallic plate shape and a thickness t1 through a press mold. The lead frame 1 is formed of an upper structure pattern having a thickness t2 at the surface (a mounting surface of a light emitting diode 10) and a lower structure pattern having a thickness t3 at the lower surface. The upper structure and the lower structure are made of the same metallic thin plate to be integrated with each other. The lead frame 1 is made of a copper thin plate, iron/nickel alloy thin plate or copper/nickel/tin metallic thin plate. However, it is preferable to use copper or copper alloy having high heat conductivity for a metal material in order to improve a heat radiating property of the lead frame 1. Further, not limited thereto, a metal material such as aluminum alloy may be employed.

As shown in FIGS. 1, 3, 4 and 5, the upper structure pattern having the thickness t2 of the lead frame 1, which is smaller in a thickness than the metal thin plate having the thickness t1, comprises a pad part 2 and one or plural lead parts 2a. The lead part 2a is separated from the pad part 2 and is formed to be adjacent to the pad part 2 at a predetermined interval. As shown in FIGS. 2, 3, 4 and 5, the lower structure pattern having the thickness t3 comprises a radiator 3 (heat radiating plate) integral with the pad part 2 on the lower surface of the pad part 2, and a radiator 3a (heat radiating plate) integral with the lead part 2a at the lower surface of the lead part 2a. In FIG. 5, W denotes one example of a wire (gold wire). The wire is connected between the light emitting diode (LED chip) 10 mounted on the chip mounting upper surface A of the pad part 2 and an electric connection area C of the lead part 2a by wire bonding, and electrically connects the light emitting diode 10 and the electric connection area. C.

Figure 1:
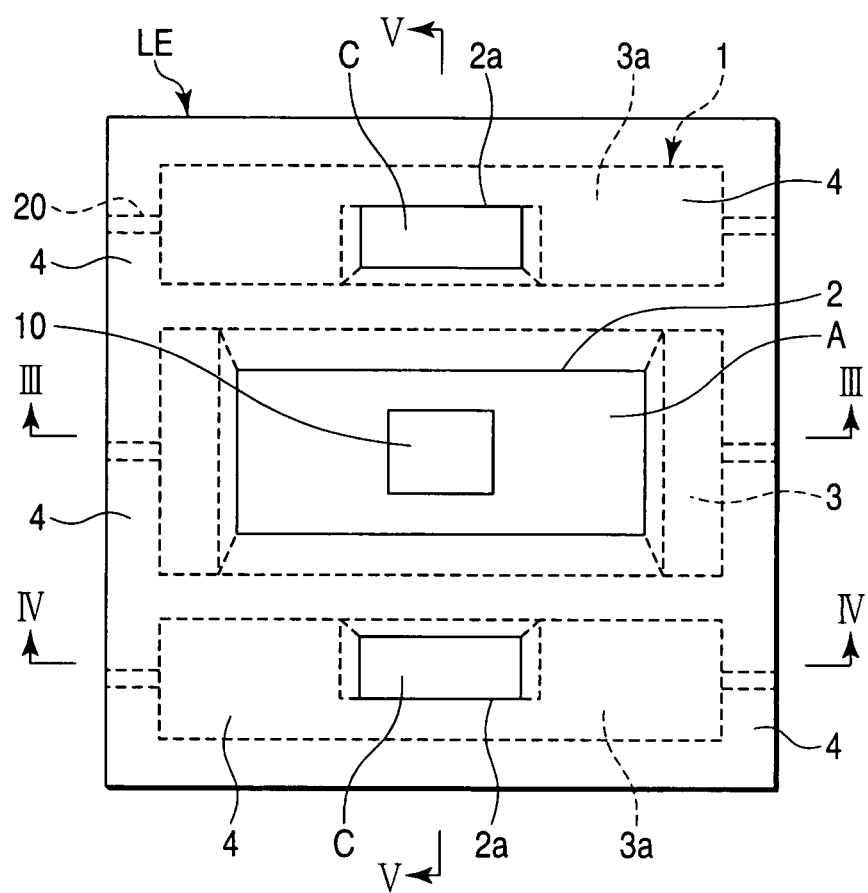
FIG. 1 is an upper view of a semiconductor light emitting device manufactured using a lead frame according to a first embodiment of the present invention.

As shown in FIGS. 1, 3 and 5, the surface (upper surface) of the pad part 2 is the mounting upper surface A having an area S1 for mounting the LED chip 10 thereon. The outer surface (lower surface) of the radiator 3 on the lower surface opposite to the pad part 2 is a radiating lower surface B (heat radiating plate) having an area S2 for radiating heat to the outside from the lower surface of the pad part 2. In other words, the radiator 3 functions to radiate drive heat occurring from a body of the LED chip 10 and heat under an ambient environmental condition of the LED chip 10, and to prevent the heat from being accumulated in the LED chip 10.

As shown in FIGS. 1, 4 and 5, the lead part 2a is formed at the same time as the formation of the pad part 2 during the punching in the base material using a press mold. The surface of the lead part 2a is the electric connection area (wire bonding area) C having an area S3 which is subjected to silver plating or the like. Thus, the connectivity can be improved when the LED chip 10 and the lead part 2a are electrically connected to each other by wire bonding, chip bonding or the like. The outer surface (lower surface) of the radiator 3a on the lower surface opposite to the lead part 2a is a radiating lower surface D (heat radiating plate) having an area S4.

The mounting upper surface A of the pad part 2 and the electric connection area C of the lead part 2a are made of the same lead frame base material (such as plate-shaped base material). The radiating lower surface B of the pad part 2 and the radiating lower surface D of the lead part 2a are made of the same plate-shaped base material. Thus, the surface of the mounting upper surface A and the surface of the electric connection area C, and the surface of the radiating lower surface B and the surface of the radiating lower surface D are in the same planes, respectively.

The electric connection area C of the lead part 2a is connected to the LED device 10 mounted on the mounting upper surface A of the pad part 2 by wire bonding, chip bonding, or the like. In this manner, the electric connection area C includes an area to which a wire for connecting to the LED chip 10 mounted on the mounting upper surface A of the pad part 2 is bonded or an area to which a connection electrode formed on the LED chip 10 is chip-bonded by soldering.

The aforementioned plating formed in the electric connection area C may employ gold plating or palladium plating instead of silver plating. Underlying plating such as Ni (nickel) plating, which is excellent in heat-radiating resistance, can be performed before performing silver plating, gold plating or palladium plating on the electric connection area C. Further, the underlying plating such as silver plating, gold plating, palladium plating or Ni (nickel) plating may be performed also on the radiating lower surface in order to mount and connect a semiconductor light emitting device LE on and to an outer substrate.

In the present invention, as shown in FIG. 3, the relationship between the area S1 of the mounting upper surface A of the pad part 2 and the area S2 of the radiating lower surface B is represented by S1<S2. In other words, the area of the radiating lower surface B is set to be larger than the area of the mounting upper surface A. As shown in FIG. 4, the relationship between the area S3 of the wire bonding area C of the lead part 2a and the area S4 of the radiating lower surface D is represented by S3<S4. In other words, the area of the radiating lower surface D is set to be larger than the area of the wire bonding area C.

As shown in FIG. 3, the side surfaces of the pad part 2 between the mounting upper surface A of the pad part 2 and the radiating lower surface B of the radiator 3 are formed as stepped parts or tapered parts E which spread in a direction from the mounting upper surface A toward the radiating lower surface B (from the upper surface of the lead frame 1 toward the lower surface). The lines drawn from the upper surface A to the lower surface B are bent or curved relative to the stepped parts or tapered parts E at the side surfaces. The resin to be filled later through molding process can be held by the stepped parts or tapered parts E so as not to come off from the frame upper surface toward the lower surface.

As shown in FIG. 4, the side surfaces of the lead part 2a between the area C of the lead part 2a and the radiating lower surface D are formed as the stepped parts or tapered parts E which spread in a direction from the area C toward the radiating lower surface D (from the upper surface of the lead frame 1 to the lower surface). The lines drawn from the area C to the lower surface D are bent or curved relative to the stepped parts or tapered parts E at the side surfaces. The resin to be filled later through the filling process of molding can be held by the stepped parts or tapered parts E so as not to come off from the frame upper surface to the lower surface.

(Method of Manufacturing Lead Frame)

Next, a method of manufacturing lead frame according to the present embodiment will be described.

First, punching using a press mold is performed on a plate-shaped lead frame metal material such as iron/nickel alloy thin plate or copper/nickel/tin metal alloy. Thus, a penetrating part is formed in the metal material. In other words, as shown in FIGS. 1, 2, 3, 4 and 5, there is formed the lead frame 1 which is configured to include the pad part 2 and the radiator 3 for which the relationship between the area S1 of the mounting upper surface A and the area S2 of the radiating lower surface B is represented by S1<S2, and the lead part 2a and the radiator 3a for which the relationship between the area S3 of the electric connection area C and the area S4 of the radiating lower surface D is represented by S3<S4.

At this time, a mold including a concave portion or convex portion having a tapered side surfaces in a cross-part view is used so that the stepped parts or tapered parts E which spread in a direction from the mounting upper surface A toward the radiating lower surface B are formed at the side surfaces of the pad part 2 between the mounting upper surface A and the radiating lower surface B. Similarly, the stepped parts or tapered parts E which spread in a direction from the electric connection area C toward the radiating lower surface D are formed at the side surfaces of the lead part 2a between the electric connection area C and the radiating lower surface D. The resin (resin-filled) to be filled during the molding can be held by the stepped parts or tapered parts E.

The lead frame 1 according to the present embodiment may be formed by a photoetching method using photoresist as described later.

Next, a series of molding of resin described in the following examples is performed on the lead frame 1 to obtain a lead frame for a semiconductor light emitting device.

Figure 12:
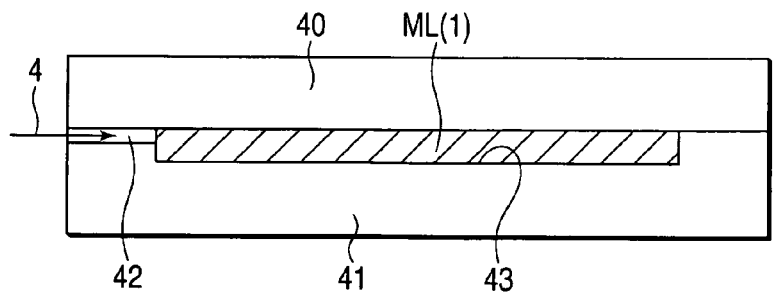
FIG. 12 is a cross-section view for explaining one example of a molding of resin in a lead frame by using a mold.

First, the lead frame 1 is mounted inside the concave portion of the mold previously formed as a predetermined inner shape (for example, the concave portion having the same depth t1 as the thickness t1 of the lead frame material). As shown in FIG. 12, the mold is typically configured of two molds of a plate-shaped upper mold 40 as a lid and a lower mold 41. A concave part 43 connected an injection port 42 configured to inject a melt resin 4 is formed as an inner space in the lower mold 41. The lead frame 1 (multi-faced lead frame ML) can be mounted in the concave part 43. The lead frame 1 is mounted in the concave part 43 of the lower mold 41 and then the upper mold 40 is integrated with and fastened to the lower mold 41.

Next, the thermally-melt resin-filled 4 is injected into the concave part 43 (inner space) through the injection port 42. Thus, the mounted lead frame 1 (multi-faced lead frame ML) is filled with the resin-filled 4 to obtain the shaped and resin-filled lead frame. After the shaping, the upper mold is cooled and detached and the lead frame 1 is taken out from the lower mold. Thus, the resin-filled 4 having the same thickness as the thickness t1 of the lead frame 1 is formed. The respective surfaces of the mounting upper surface A and the radiating lower surface B, as well as, the respective surfaces of the electric connection area C and the radiating lower surface D are exposed to the outside from the resin-filled, respectively. In this manner, there is formed the lead frame for a semiconductor light emitting device in which the resin-filled fills between the pad part 2 and the lead part 2a.

Figure 2:
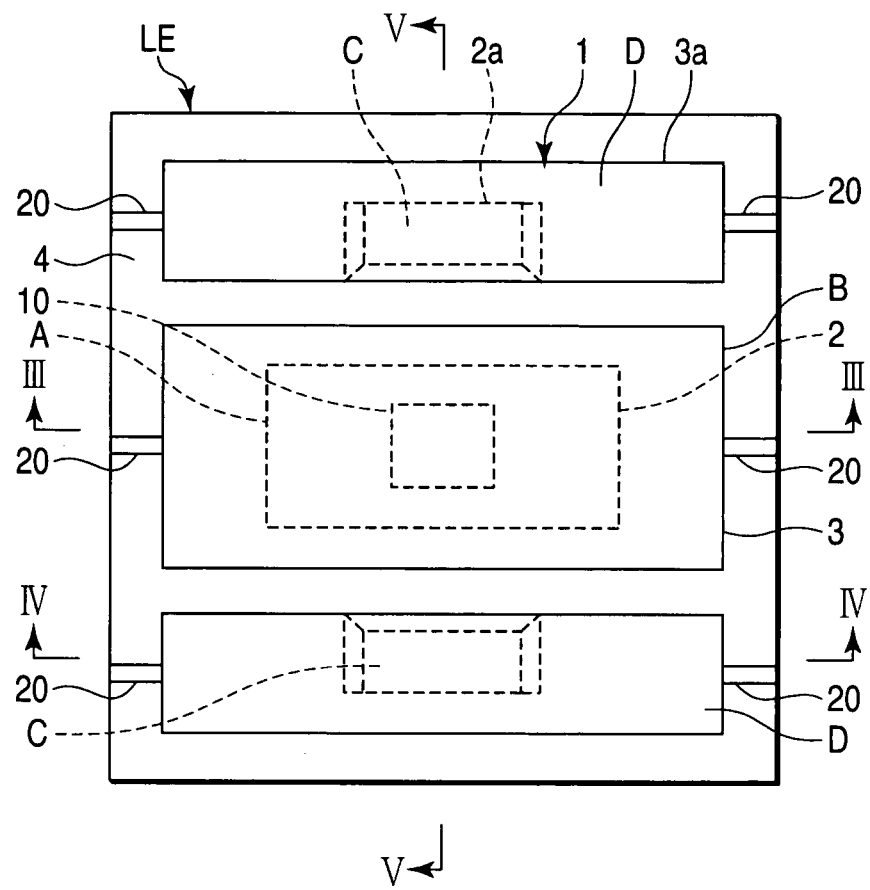
FIG. 2 is a lower view of the semiconductor light emitting device manufactured using the lead frame according to the first embodiment of the present invention.

A suspending lead 20 shown in FIGS. 1 and 2 is designed to prevent the pad part 2 and the lead part 2a from coming off the metal material after the punching using a press mold. Thus, the suspending lead 20 is formed for connecting and holding the pad part 2 and the lead part 2a to and on the metal material for a necessary period of time. Therefore, the suspending leads 20 are cut so that an individual lead frame (unit frame described later) is obtained. In each cross-part view, the suspending lead 20 is not illustrated. The connecting part between the suspending lead 20 and the metal material is cut so that the lead frame is separated. The suspending lead 20 is cut after the LED chip is mounted or after the resin is molded, but may be appropriately cut.

Next, a semiconductor light emitting device according to the present embodiment will be described. As shown in FIGS. 1, 2, 3, 4 and 5, the semiconductor light emitting device has the lead frame 1 comprising, in the same plane, one or plural pad parts 2 for having the LED chip 10 mounted thereon and the lead part 2a having the electric connection area C in which the electric connection with the LED chip 10 is made.

The lead frame 1 is subjected to the molding, in the thickness direction, by the resin 4 from the LED chip mounting upper surface A of the pad part 2 toward the radiating lower surface B of the radiator 3 opposite to the mounting upper surface A, and from the electric connection area C of the lead part 2a toward the radiating lower surface D of the radiator 3a opposite to the area C.

Areas on and above the mounting upper surface A of the pad part 2 and the electric connection area C of the lead part 2a, including the LED chip 10 and the electric connection area C, are covered by a transparent resin 5 in a layered manner. The transparent material 5 is layered in the Figures but may be dome-shaped.

In the lead frame 1, the relationship between the area S1 of the mounting upper surface A of the pad part 2 and the area S2 of the radiating lower surface B of the radiator 3 is set at 0<S1<S2, and the relationship between the area S3 of the wire bonding area C and the area S4 of the radiating lower surface D of the radiator 3a is set at 0<S3<S4. In other words, the lead frame 1 has a shape, for example, in which the pad part 2 having a smaller area (area in the plan view of FIG. 1) than the radiator 3 projects from the bed-shaped radiator 3, and in which the lead part 2a having a smaller area than the radiator 3a projects from the bed-shaped radiator 3a.

Thus, the radiating site can be set to be wide and the LED device which is excellent in a radiating property can be obtained. The stepped parts or tapered parts E which spreads from the mounting upper surface A toward the radiating lower surface B and from the electric connection area C toward the radiating lower surface D are formed at the side surfaces of the pad part 2 and the lead part 2a between the mounting upper surface A and the radiating lower surface B and between the electric connection area C and the radiating lower surface D, respectively. Thus, when the resin 4 is melt and molded and after the resin is molded, the resin 4 is held by the stepped parts or tapered parts E and the contact area between the resin 4 and the lead frame is made larger. Thus, the filled resin 4 and the lead frame are strongly attached together. Thereby, it is possible to prevent the lead frame from coming off the resin 4 and the resin 4 from coming off the lead frame.

In the semiconductor light emitting device according to the present embodiment, the LED device 10 emits a light while being embedded inside the layer of the transparent resin 5. Thus, when the light emitted from the LED device 10 exits from the transparent resin 5 to the outside, it is important to have a high optical gain property. Thus, it is needless to say that a resin with excellent transparency such as acrylic resin (poly-meta-methyl-acrylate resin) is selected as the transparent resin 5. Further, the present inventors particularly propose to use, for the resin-filled 4, a resin having a high reflectivity at the interface between the resin-filled 4 and the transparent resin 5.

The resin 4 desirably has a high reflectivity, and further has heat resistance, light resistance, heat conductivity and high light diffusing property. Thus, the resin 4 is desirably an organic polymer material such as epoxy resin, modified epoxy resin, silsesquioxane based rein, silicon resin, acrylic resin, polycarbonate resin, aromatic polyester resin (unsaturated polyester resin), polyamide based resin, polyphthalamide (PPA), liquid crystal polymer (LCP) or cycloolefin based rein. One resin or a mixture of multiple resins may be employed.

The relationship between the optical refraction index n1 of the resin-filled 4 and the optical refraction index n2 of the transparent resin 5 is set at n1>n2 so that a high light reflectivity can be obtained at the interface between the resin 4 and the transparent resin 5. Further, the larger the difference in refraction index between the resin 4 and the transparent resin 5 is, the higher the reflection can be exhibited. However, since the refraction index of the resin is generally 2 or less, there is a limitation for increasing the difference in refraction index only by the resin. Thus, the present invention proposes to use a light diffusing resin, as the resin 4, in which an additive such as a powdery substance or particulate substance is mixed into the one resin or mixture of multiple resins. Thus, the refraction index n of the resin 4 can be set at 2 or more. Therefore, a high reflectivity can be obtained at the interface between the resin 4 and the transparent resin 5. The additive to be added to the resin 4 may include $SiO_2$, $TiO_2$, $Al_2O_3$, zirconium oxide, ceramic material or a mixture thereof. The mixing ratio of the additive to the main resin can be appropriately set. For example, the ratio is 1% to 20% or more.

In the following, effects caused by the resin-filled 4 having a light reflecting property will be described.

As shown in FIG. 6, a light L emitted from the LED chip 10 travels inside the transparent resin 5 and is discharged to the outside. However, part of the light emitted from the LED chip 10 reflects on the interface with the transparent resin 5 contacting the outside (air) (reflected light M in FIG. 6 (such as totally-reflected light or semireflected light)). Thereafter, the reflected light M reaches the surface of the resin-filled 4. At this time, when the resin 4 has a high light reflectivity, the reflected light M can be reflected again on the surface of the resin 4 (the re-reflected light N in FIG. 6). In other words, the re-reflected light N can be discharged from the LED device. On the other hand, when the resin-filled does not have a reflectivity, the reflected light M enters the resin-filled as it is, and is not discharged from the LED device.

As described above, the resin 4 has a high light reflectivity so that the light emitted from the LED chip 10 can be efficiently discharged to the outside.

When metal plating has been performed on the LED chip mounting upper surface A and the electric connection area C, the reflected light M may be the re-reflected light N at the plated surface. Thus, the fact is preferable for efficiently utilizing the light emitted from the LED chip 10.

A ceramic ink excellent in a light reflectivity is more preferably used to coat the surface of the resin 4 in order to efficiently utilize the light emitted from the LED chip 10.

Second Embodiment

Next, a second embodiment of the present invention will be described below with reference to FIGS. 7, 8 and 9.

A lead frame 1 according to the present embodiment is formed by photoetching a base material having a metallic thin plate shape. In other words, as shown in FIGS. 7, 8 and 9, the lead frame 1 is formed by photoetching the base material having a thickness t1 and a metallic thin plate shape from both sides. The lead frame 1 is formed of an upper structure pattern having a thickness t2 on the surface (a mounting surface of a light emitting diode 10) and a lower structure pattern having a thickness t3 at the lower surface. Since being made of the same metallic thin plate, the upper structure and the lower structure are integrated. A plate-shaped copper thin plate, an iron/nickel alloy thin plate, or a copper/nickel/tin metallic thin plate is used for the material of the lead frame 1. However, it is more preferable to use copper or copper alloy having high heat conductivity for improving the heat radiating property of the lead frame 1. Not limited thereto, a metallic material such as aluminum alloy may be employed.

Figure 7:
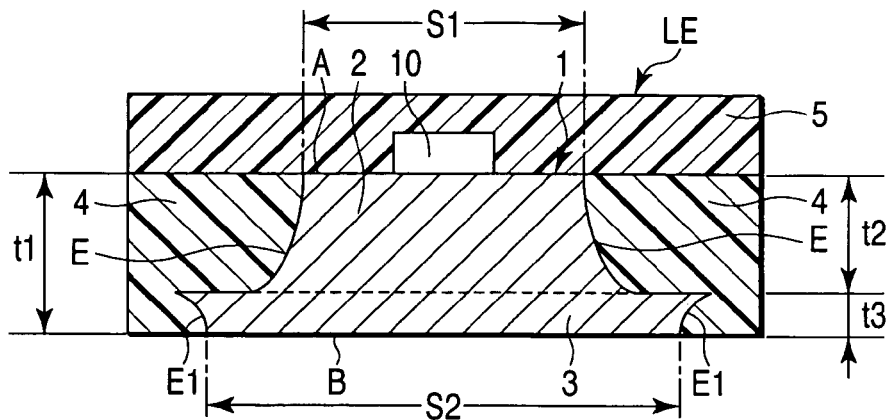
FIG. 7 is a cross-section view along line of FIG. 1 showing a semiconductor light emitting device manufactured using a lead frame according to a second embodiment of the present invention.
Figure 8:
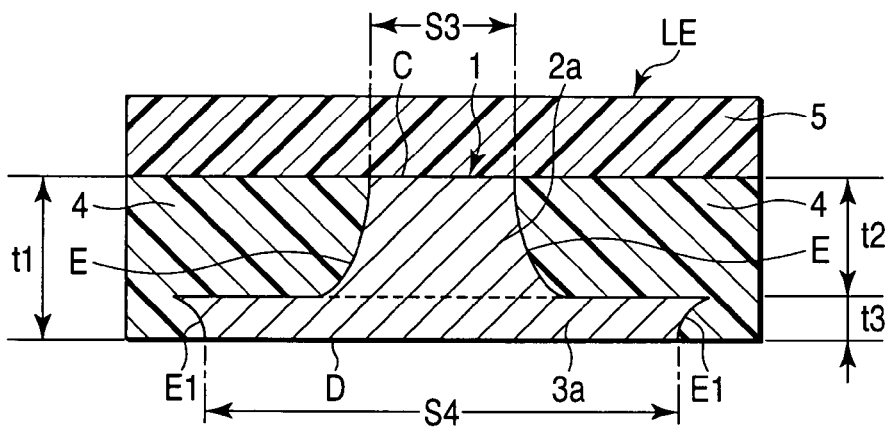
FIG. 8 is a cross-section view along IV-IV line of FIG. 1 showing the semiconductor light emitting device manufactured using the lead frame according to the second embodiment of the present invention.
Figure 9:
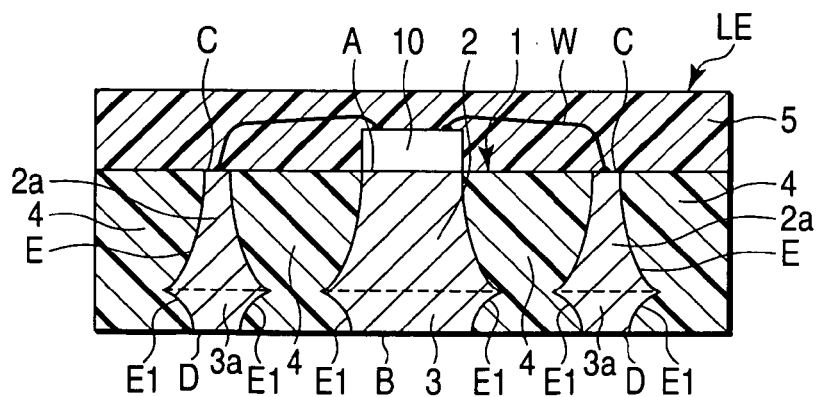
FIG. 9 is a cross-section view along V-V line of FIG. 1 showing the semiconductor light emitting device manufactured using the lead frame according to the second embodiment of the present invention.

As shown in FIGS. 7, 8 and 9, the upper structure pattern having the thickness t2 of the lead frame 1, which is smaller in a thickness than the metallic thin plate having the thickness t1, comprises a pad part 2, and one or plural lead parts 2a. The lead part 2a is separated from the pad part 2 and is formed to be adjacent to the pad part 2 at a predetermined interval. Further, as shown in FIGS. 7, 8 and 9, the lower structure pattern having the thickness t3 comprises a radiator 3 (heat radiating plate) integrated with the pad part 2 at the lower surface of the pad part 2, and a radiator 3a (heat radiating plate) integrated with the lead part 2a at the lower surface of the lead part 2a. In FIG. 9, W denotes one example of wire (gold wire). The wire is connected between the light emitting diode (LED chip 10) mounted on a chip mounting upper surface A of the pad part 2 and an electric connection area C of the lead part 2a by wire bonding, and electrically connects the light emitting diode and the electric connection area C.

As shown in FIGS. 7 and 9, the surface (top surface) of the pad part 2 is the mounting upper surface A having an area S1 configured to mount the LED chip 10 thereon. The outer surface (lower surface) of the radiator 3 opposite to the pad part 2 is a radiating lower surface B (heat radiating plate) having an area S2 configured to radiate heat from the lower surface of the pad part 2 to the outside. In other words, the radiator 3 functions to radiate drive heat occurring from a body of the LED chip 10 or heat under an ambient environmental condition of the LED chip 10 and to prevent the heat from being accumulated in the LED chip 10.

As shown in FIGS. 8 and 9, the lead part 2a is formed at the same time as the formation of the pad part 2 while photoetching is performed on the lead frame base material. The surface of the lead part 2a is the electric connection area (wire bonding area) C having an area S3 subjected to silver plating or the like. Thus, connectivity can be improved when the LED chip 10 is electrically connected to the lead part 2a by wire bonding, chip bonding or the like. The outer surface (lower surface) of the radiator 3a opposite to the lead part 2a is a radiating lower surface D (heat radiating plate) having an area S4.

The mounting upper surface A of the pad part 2 and the surface of the electric connection area C of the lead part 2a are made of the same lead frame base material (such as plate-shaped base material). The radiating lower surface B of the pad part 2 and the radiating lower surface D of the lead part 2a are made of the same plate-shaped base material. Thus, the surface of the mounting upper surface A and the surface of the electric connection area C, and the surface of the radiating lower surface B and the surface of the radiating lower surface D are in the same planes, respectively.

The electric connection area C of the lead part 2a is connected to the LED device 10 mounted on the mounting upper surface A of the pad part 2 by wire bonding or chip bonding. In this manner, the electric connection area C is formed of an area to which the wire for connecting to the LED chip 10 mounted on the mounting upper surface A of the pad part 2 is bonded and an area to which a connection electrode formed in the LED chip 10 is chip-bonded by soldering.

The plating formed in the electric connection area C described above may employ gold plating or palladium plating instead of silver plating. Underlying plating such as Ni (nickel) plating which is excellent in heat diffusing resistance may be performed before the electric connection area C is subjected to silver plating, gold plating or palladium plating. Further, the underlying plating such as silver plating, gold plating, palladium plating or Ni (nickel) plating may be performed also on the radiating lower surface in order to mount and connect a semiconductor light emitting device LE on and to an outer substrate.

As shown in FIG. 7, in the lead frame 1 according to the present embodiment, the relationship between the area S1 of the LED chip mounting upper surface A having the LED chip mounted thereon and the area S2 of the radiating lower surface B of the radiator 3 opposite to the mounting upper surface A is represented by 0<S1<S2. In this way, the radiating surface is provided on the lower surface of the lead frame 1 and the radiating surface is made larger so that the radiating effect improves.

In the lead frame 1, the pad part 2 configures the upper structure having the mounting upper surface A. On the other hand, the radiator 3 (heat radiating plate) configures the lower structure having the radiating lower surface B. The lower structure is formed to be integral with the upper structure at the bottom part (the lower surface of the pad part 2) opposite to the upper structure. The lower structure and the upper structure have a shape in which the pad part 2 having a smaller area (the area in the plan view of FIG. 1) than the radiator 3 projects from the bed-shaped radiator 3, for example.

There are formed stepped parts or tapered parts E configured to hold a resin filled during the resin molding, which spread in a direction from the mounting upper surface A toward the radiating lower surface B, at the side surfaces of the upper structure as the pad part 2 between the mounting upper surface A and the radiating lower surface B. On the other hand, there are formed tapered parts E1 configured to hold a resin filled during the resin molding, which spread in a direction from the radiating lower surface B toward the mounting upper surface A, at the side surfaces of the lower structure as the radiator 3 (heat radiating plate).

As shown in FIG. 8, the relationship between the area S3 of the electric connection area C of the lead part 2a of the lead frame 1 and the area S4 of the radiating lower surface D of the radiator 3a opposite to the electric connection area C is represented by 0<S3<S4. In this way, the radiator 3a integral with the lower surface of the lead part 2a is provided and the radiating surface of the radiator 3a is increased so that the radiating effect improves.

The electric connection area C is formed in plane with the mounting upper surface A of the pad part 2 and the radiating lower surface D is formed in plane with the radiating lower surface B of the pad part 2.

In the lead frame 1, the lead part 2a configures the upper structure having the electric connection area C. On the other hand, the radiator 3a (heat radiating plate) configures the lower structure having the radiating lower surface D. The lower structure is formed to be integral with the upper structure at the bottom part (the lower surface of the lead part 2a) opposite to the upper structure. The lower structure and the upper structure have a shape in which the lead part 2a having a smaller area (the area in the plan view of FIG. 1) than the radiator 3a projects from the bed-shaped radiator 3a, for example.

There is formed the stepped parts or tapered parts E configured to hold the resin filled during the resin molding, which spread in a direction from the electric connection area C toward the radiating lower surface D, at the side surfaces of the upper structure as the lead part 2a between the electric connection area C and the radiating lower surface D. On the other hand, there are formed the tapered parts E1 configured to hold the resin filled during the resin molding, which spread in a direction from the radiating lower surface D toward the electric connection area C, at the side surfaces of the lower structure as the radiator 3 (heat radiating plate).

The stepped parts or tapered parts E and the tapered parts E1 hold the resin to be filled later by the molding so as not to come off the frame. Particularly, the resin is held in the lead frame so as not to come off in the surface and lower surface directions.

As described later, photoresist (photosensitive resin) is applied on both surfaces of a lead frame metal plate, pattern exposure, development processing and the like are performed on the photoresist to form a resist pattern, and then an etchant such as ferric chloride is used from both surfaces to photoetch a resist-free portion, so that the lead frame 1 according to the present embodiment is formed. As being formed in this manner, the lead frame 1 comprises the pad part 2 configured to mount the LED device thereon, and the lead part 2a separated from the pad part 2 to be insulated therefrom.

(Method of Manufacturing Lead Frame)

Next, a method of manufacturing lead frame according to the present embodiment will be described.

First, photoresist (photosensitive resin) is applied on the surface of the lead frame metal material having the thickness t1, which is made of metal material such as an iron/nickel alloy thin plate or a copper/nickel/tin metallic thin plate so that a photoresist layer is formed. Next, a pattern is exposed on the photoresist layer via a pattern exposure photomask having a predetermined pattern. Through the pattern exposure, there are exposed the patterns configured to form the mounting upper surface A having the area S1 of the pad part 2 and the electric connection area C having the area S3 of the lead part 2a. Then, developing, and, as necessary, film hardening is performed on the photoresist layer. Thus, the photoresist is removed having the mounting upper surface A of the pad part 2 and the electric connection area C of the lead part 2a left thereon. In other words, the resist pattern is formed on the site in which the mounting upper surface A of the pad part 2 on one surface (upper surface) of the metal material is formed and on the site in which the electric connection area C of the lead part 2a is formed.

Similarly, after the photoresist is applied also on the other surface (lower surface) of the metal material to form the photoresist layer, a series of processings including pattern exposure and development is performed. In the pattern exposure, the patterns for forming the radiating lower surface B having the area S2 (S1<S2) and the radiating lower surface D having the area S4 (S3<S4) are exposed, and then development, film hardening and the like are performed. Thus, the photoresist is removed having the portion corresponding to the radiating lower surface B of the pad part 2 and the portion corresponding to the radiating lower surface D of the lead part 2a left thereto. In other words, the resist patterns are formed in the site in which the radiating lower surface B is formed and in the site in which the radiating lower surface D is formed. Thus, the resist patterns having the difference in areas between the photoresist-free portions ($\Delta SP=S2-S1$, $\Delta SP>0$, $\Delta SL=S4-S3$, $\Delta SL>0$) are formed on both surfaces of the lead frame metal material, respectively.

Subsequently, a corrosion-resistant resin film is applied on the lower surface of the metal material. Then, the etchant such as ferric chloride is used from the surface of the metal material to perform an etching processing (half-etching processing). At this time, the photoresist-free portion on the surface of the metal material is etched down to a predetermined depth (thickness t2 shown in FIGS. 7 and 8, for example). Thereafter, cleansing or the like is performed so that the corrosion-resistant resin film is applied on the surface of the metal material.

Next, the corrosion-resistant resin film is removed from the lower surface of the metal material and the etchant such as ferric chloride is used from the lower surface of the metal material to perform the etching processing (half-etching processing). At this time, the photoresist-free portion on the lower surface of the metal material is etched down to a predetermined depth (thickness t3 shown in FIGS. 7 and 8, for example). In this way, the total value of the etching depths t2 and t3 formed by the half-etching from both surfaces is set to be equal to or larger than the thickness t1 of the metallic thin plate. Thus, a penetrating part is formed on the metallic sites in which the resist pattern is not formed corresponding to the surface and the lower surface of the metal material. In other words, as shown in FIGS. 7, 8 and 9, there is formed the lead frame 1 formed of the pad part 2 and the radiator 3 for which the relationship between the area S1 of the mounting upper surface A and the area S2 of the radiating lower surface B represented by S1<S2, and the lead part 2a and the radiator 3a for which the relationship between the area S3 of the electric connection area C and the area S4 of the radiating lower surface D is represented by S3<S4.

In the above description, the etching is performed once on each of the surface and the lower surface, that is, performed twice in total. However, the etching may be simultaneously performed on the metal material from both surfaces at one time.

When the etching processing is performed on the metal material site exposed from the resist pattern, isotropic etching is performed on the metal material site exposed from the resist pattern. Thus, when the etching (half-etching) is performed from both surfaces of the metal material, respectively, the lead frame 1 which is reversely tapered between both surfaces of the metal material is consequently obtained. In other words, when the tapered parts E spread in a direction from the upper surface toward the lower surface, the tapered parts E1 spread in a direction from the lower surface toward the upper surface. As illustrated, the side shapes of the tapered parts E and the tapered parts E1 may be bent or curved. The lead frame which includes a tapered portion on one surface and a reversely tapered portion on the other surface can prevent the resin from coming off the plate-shaped lead frame as described later.

Next, a series of resin molding described in the following examples are performed on the lead frame 1 to obtain a lead frame for a semiconductor light emitting device.

First, the lead frame 1 is mounted inside a concave portion of a mold previously formed having a predetermined inner shape (for example, a concave portion having the same depth t1 as the thickness t1 of the lead frame material). As shown in FIG. 12, the mold is typically configured of two molds of a plate-shaped upper mold 40 as a lid and a lower mold 41. A concave part 43 penetrating through an injection port 42 configured to inject a melt resin 4 is formed as an inner space in the lower mold 41. The lead frame 1 (multi-faced lead frame ML) can be mounted in the concave part 43. The lead frame 1 is mounted in the concave part 43 of the lower mold 41 and then the upper mold 40 is integrated with and fastened to the lower mold 41.

Next, the thermally-melt resin-filled 4 is injected into the concave part 43 (inner space) through the injection port 42. Thus, the mounted lead frame 1 (multi-faced lead frame ML) is filled with the resin 4 to obtain the lead frame in which a shaped resin is filled. After the shaping, the upper mold is cooled and detached and the lead frame 1 is taken out from the lower mold. Thus, the resin-filled 4 having the same thickness as the thickness t1 of the lead frame 1 is formed. The respective faces of the mounting upper surface A and the radiating lower surface B and the respective faces of the electric connection area C and the radiating lower surface D are exposed to the outside from the resin-filled, respectively. In this manner, there is formed the lead frame for a semiconductor light emitting device in which the resin-filled is filled between the pad part 2 and the lead part 2a.

A suspending lead 20 shown in FIGS. 1 and 2 is designed to prevent the pad part 2 and the lead part 2a from coming off the metal material, and it is desirably formed for obtaining the lead frame according to the second embodiment. The suspending lead 20 is formed for connecting and holding the pad part 2 and the lead part 2a to and on the metal material for a necessary period of time. Therefore, the suspending lead 20 is cut so that an individual lead frame (unit frame described later) is obtained. In each cross-part view of the second embodiment, the suspending lead 20 is not illustrated. The connecting part between the suspending lead 20 and the metal material is cut so that the lead frame is separated. The suspending lead 20 is cut after the LED chip is mounted or after the resin is molded, but may be appropriately cut.

Next, a semiconductor light emitting device according to the present embodiment will be described. As shown in FIG. 9, the semiconductor light emitting device LE has the lead framed comprising, in the same plane, one or plural pad parts 2 having the LED chip 10 mounted thereon and the lead part 2a having the electric connection area C in which an electric connection with the LED chip 10 is made.

The resin 4 of the lead frame 1 is subjected to the molding, in the thickness direction, from the LED chip mounting upper surface A of the pad part 2 toward the radiating lower surface B of the radiator 3 opposite to the mounting upper surface A, and from the electric connection area C of the lead part 2a toward the radiating lower surface D of the radiator 3a opposite to the area C.

On and above the mounting upper surface A of the pad part 2 and the electric connection area C of the lead part 2a, including the LED chip 10 and the electric connection area C, is covered by a transparent resin 5 in a layered manner. The transparent material 5 is layered in the Figures but may be dome-shaped.

The relationship between the area S1 of the mounting upper surface A of the pad part 2 and the area S2 of the radiating lower surface B of the radiator 3 is set at 0<S1<S2, and the relationship between the area S3 of the wire bonding area C and the area S4 of the radiating lower surface D of the radiator 3a is set at 0<S3<S4. The lead frame 1 is molded with the resin-filled to have the same thickness as the thickness t1 of the lead frame 1 so that the radiating lower surface B and the radiating lower surface D are exposed from the resin-filled. Thus, the radiating site can be set to be wide and the surface of the radiating site is exposed so that the LED device which is excellent in a radiating property can be obtained. Further, the tapered parts E and E1 are provided on the side surface of the lead frame 1. Thus, when the resin 4 is melt and molded and after the resin is molded, the resin 4 is held by the stepped parts or tapered parts E and E1. The contact area between the resin 4 and the lead frame is made larger. Therefore, the resin-filled 4 and the lead frame are strongly attached together. Thereby, it is possible to prevent the lead frame from coming off the resin 4 and the resin 4 from coming off the lead frame.

The point will be further described. In the lead frame 1 having the structure according to the present embodiment, the tapered parts E of the upper structure spreads, for example, in a direction from the upper surface toward the lower surface, and the tapered parts E1 of the lower structure spreads, for example, in a direction from the lower surface toward the upper surface. In the other words, the upper structure and the lower structure are reversely tapered. Thus, the site where each of the tapered part of the upper structure and each of the tapered part of the lower structure meet is a convex portion in a side view. After the molding, the resin-filled 4 at each of the sites immediately between the pad part 2, the radiator 3 and the lead part 2a, the radiator 3a is concave in correspondence to the convex portion. Thus, the resin-filled 4 has a narrow site between the upper site (the site at the upper structure side) and the lower site (the site at the lower structure side). In other words, as shown in FIG. 9, the cross-part shape of the resin 4 is like an hourglass, for example. The resin 4 has a part whose diameter is larger than the narrow portion, and where the diameter is large, the contact area between the resin-filled 4 and the lead frame 1 is made larger and the adhesion between the lead frame and the resin-filled increases. The hourglass resin 4 has a narrow portion and the convex portion where the both tapered parts of the lead frame meet meshes with the narrow portion of the resin-filled 4. In other words, the narrow portion of the resin-filled is held by the convex portion. Thus, the resin 4 can be prevented from coming off the lead frame 1. Such a structure is particularly effective to prevent the resin 4 from coming off the lead frame, which is cut into a plate shape after the filling of resin, in the thickness direction (in the upper surface direction and in the lower surface direction) of the lead frame.

Since the lead frame according to the present embodiment can be formed by a typical photoetching method at low cost, it makes it possible to supply the lead frame at low cost.

In the semiconductor light emitting device according to the present embodiment, the LED device 10 emits a light while being embedded inside the layer of the transparent resin 5. Thus, when the light emitted from the LED device 10 exits from the transparent resin 5 to the outside, it is important to have a high optical gain property. Thus, it is needless to say that a resin which is excellent in transparency such as acrylic resin (poly-meta-methyl-acrylate resin) is selected as the transparent resin 5. Further, the present inventors particularly propose to use, for the resin-filled 4, a resin having a high reflectivity at the interface between the resin-filled 4 and the transparent resin 5.

The resin 4 desirably has a high light reflectivity and further has heat resistance, light resistance, heat conductivity and high light diffusing property. Thus, the resin 4 is desirably an organic polymer material such as epoxy resin, modified epoxy resin, silsesquioxane based rein, silicon resin, acrylic resin, polycarbonate resin, aromatic polyester resin (unsaturated polyester resin), polyamide based resin, polyphthalamide (PPA), liquid crystal polymer (LCP) or cycloolefin based rein. One resin or a mixture of multiple resins may be employed.

The relationship between the optical refraction index n1 of the resin-filled 4 and the optical refraction index n2 of the transparent resin 5 is set at n1>n2 so that a high light reflectivity can be obtained at the interface between the resin 4 and the transparent resin 5. Further, the larger the difference in refraction index between the resin 4 and the transparent resin 5 is, the higher the reflection can be exhibited. However, since the refraction index of the resin is generally 2 or less, there is a limitation for increasing the difference in refraction index only by the resin. Thus, the present invention proposes to use a light diffusing resin, as the resin 4, in which an additive such as a powdery substance or particulate substance is mixed into the one resin or mixture of multiple resins. Thus, the refraction index n of the resin 4 can be set at 2 or more. Therefore, a high reflectivity can be obtained at the interface between the resin 4 and the transparent resin 5. The additive to be added to the resin 4 may include $SiO_2$, $TiO_2$, $Al_2O_3$, zirconium oxide, ceramic material or a mixture thereof. The mixing ratio of the additive to the main resin can be appropriately set. For example, the ratio is 1% to 20% or more.

In the following, effects caused by the resin-filled 4 having a light reflecting property will be described.

As shown in FIG. 6, a light L emitted from the LED chip 10 travels inside the transparent resin 5 and is discharged to the outside. However, part of the light emitted from the LED chip 10 reflects on the interface with the transparent resin 5 contacting the outside (air) (reflected light M in FIG. 6 (such as totally-reflected light or semireflected light)). Thereafter, the reflected light M reaches the upper surface of the resin-filled 4. At this time, when the resin 4 has a high light reflectivity, the reflected light M can be reflected again on the upper surface of the resin 4 (the re-reflected light N in FIG. 6). In other words, the re-reflected light N can be discharged from the semiconductor light emitting device. On the other hand, when the resin-filled does not have a reflectivity, the reflected light M enters the resin-filled as it is, and is not discharged from the LED device.

As described above, the resin 4 has a high light reflectivity so that the light emitted from the LED chip 10 can be efficiently discharged to the outside.

When metal plating has been performed on the LED chip mounting upper surface A and the electric connection area C, the reflected light M may be the re-reflected light N at the plated surface. Thus, the fact is preferable for efficiently utilizing the light emitted from the LED chip 10.

A ceramic ink which is excellent in a light reflectivity is more preferably used to coat the surface of the resin 4 in order to efficiently utilize the light emitted from the LED chip 10.

Third Embodiment

Next, a lead frame for a semiconductor light emitting device according to a third embodiment of the present invention will be described below with reference to FIGS. 10, 11A and 11B.

As shown in FIG. 10, in the lead frame for a semiconductor light emitting device according to the present embodiment, a pad part 2 and a lead part 2a in a lead frame 1 are assumed as a unit frame in which both surfaces are in the same plane (a dotted line Z in FIG. 10 denotes unit frame). The lead frame for a semiconductor light emitting device is manufactured with a branch-shaped or belt-shaped metal material by using a multi-faced lead frame ML in which multiple unit frames are arranged side by side in the longitudinal and lateral directions.

As shown in FIG. 10, a lattice-shaped frame called tie bar 30 is formed, for example. The tie bar 30 can prevent the lead frame 1 from coming off the metal material after etching or punching using a press mold. The unit frame is formed to be connected to the tie bar 30 within an opening area of the tie bar 30 serving as the frame. In the present embodiment, the connecting between the unit frame and the tie bar 30 is made via a suspending lead 20 branched from the tie bar 30. However, depending on a specification, the unit frame and the tie bar 30 may be directly connected instead of forming the suspending lead 20.

The tie bar 30 and the suspending lead 20 are formed in a similar method to the method for forming the pad part 2 and the lead part 2a, while forming the pad part 2 and the lead part 2a through etching or punching using a press mold. In other words, the tie bar 30 and the suspending lead 20 are formed by forming photoresist also on the metal material site where the tie bar 30 and the suspending lead 20 are formed, or are formed by having the sites corresponding to the tie bar 30 and the suspending lead 20 left during the punching using a press mold. The suspending lead 20 or the tie bar 30 is cut so that each unit frame is separated from the metal material. The lead frame as a unit frame may be the lead frame according to either the first embodiment or the second embodiment.

Figure 11A:
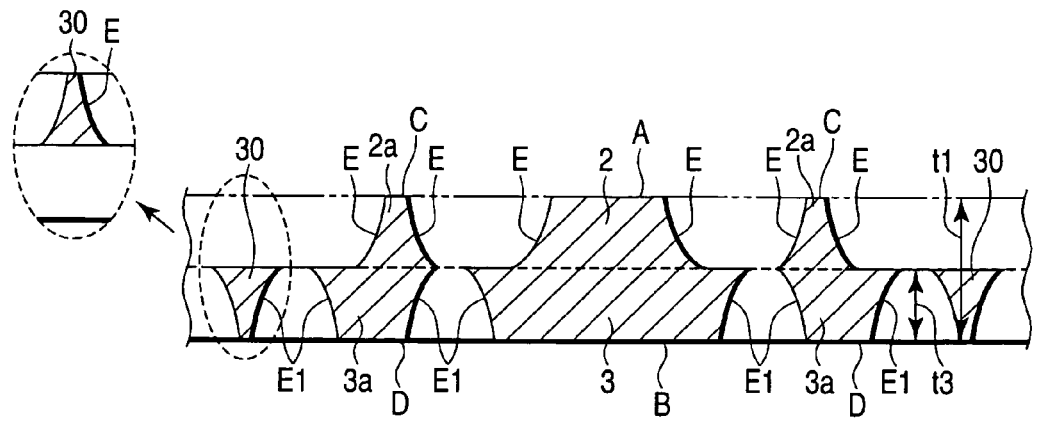
FIG. 11A is a cross-section view of FIG. 10 in an enlarged manner before a molding.
Figure 11B:
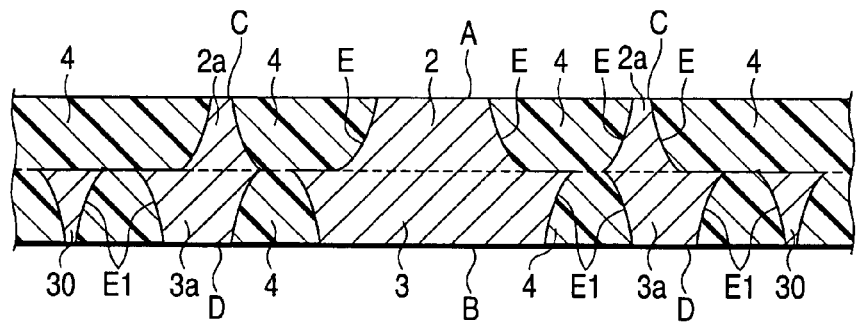
FIG. 11B is a cross-section view of FIG. 10 in an enlarged manner.

As shown in FIG. 11A, the pad part 2 and the lead part 2a as an upper structure of each unit frame formed in the multi-faced lead frame ML are formed on a lower structure having a thickness t3. Thus, the height from the lower surface of the lower structure to the upper surface of the pad part 2 and the lead part 2a is t1 which is identical to the thickness of the metal material. In the present embodiment, the surface height (thickness) of the suspending lead 20 and the tie bar 30 is set to be low (at the same thickness as the thickness t3 of a radiator 3 and a radiator 3a, for example). In other words, the thickness of the suspending lead 20 and the tie bar 30 is set to be smaller than a thickness t1 of the metal material. The suspending lead 20 and the tie bar 30, whose thickness is small in this way, are formed by performing half-etching on the metal material sites which will serve as the suspending lead 20 and the tie bar 30 when the metal material is etched to form the pad part 2 and the lead part 2a. In other words, photoresist for forming the suspending lead 20 and photoresist for forming the tie bar 30 are formed on one surface (such as the surface at the radiators 3 and 3a side) of the metal material sites on which the suspending lead 20 and the tie bar 30 are to be formed, and then the etching for forming the pad part 2 and the lead part 2a is performed from both sides of the metal material as described above. As shown in a broken line of FIG. 11A, when the suspending lead 20 and the tie bar 30 whose thickness is made smaller by performing the half-etching are formed on the upper surface (the LED chip mounting surface, the electric connection area), the photoresist for forming the suspending lead 20 and the photoresist for forming the tie bar 30 are formed on the surface (the LED chip mounting surface, the electric connection area). When the lead frame according to the first embodiment is created through the punching using a press mold, the thickness of the sites corresponding to the suspending lead 20 and the tie bar 30 may be pressed to the thickness t3 during the pressing into the metal material.

As shown in FIGS. 10 and 11A, the lead frame ML having a flat plate shape in which the lead frames 1 are manufactured by photoetching is mounted inside a mold for manufacturing the lead frame for a semiconductor light emitting device, as described above. Thereafter, a concave portion (inner space) of the mold is filled with a resin 4 and the resin 4 is shaped. Thus, as shown in FIG. 11B, filling of the resin 4 in such a manner allows a mounting upper surface A and a radiating lower surface B, as well as, an electric connection area C and a radiating lower surface D to be exposed from the resin 4, respectively, thereby forming the multi-faced lead frame ML for a semiconductor light emitting device.

Thereafter, the lead frame ML for a semiconductor light emitting device is cut and separated to obtain a unit frame. The lead frame ML for a semiconductor light emitting device may be cut after the LED chip is mounted or after a transparent resin is formed without being limited to after the resin is molded, and consequently may be cut appropriately.

When the molding of resin is performed on the multi-faced lead frame for a semiconductor light emitting device, the resin is injected into a mold having a concave portion (inner space). When the resin is injected, the resin sequentially flows from a unit frame near an injection port of the resin toward a unit frame distant from the injection port, and then the resin is molded.

In the lead frame for a semiconductor light emitting device according to the present embodiment, the upper surface (the LED chip mounting surface, the electric connection area surface) and the lower surface (radiating lower surface) are exposed from the resin-filled, respectively. Thus, the depth of the concave portion (the height of the inner space) is set to be the same as the thickness of the lead frame such that the resin does not adhere to the upper surface and the lower surface. In other words, the depth of the concave portion (the height of the inner space) is set to be the same as the thickness of the lead frame so that the upper surface and the lower surface of the lead frame adhere to the surface of the upper mold and the surface of the lower mold, respectively, when the lead frame is mounted inside the mold. Thereby, when the resin is injected into the concave portion (inner space), the resin can be prevented from adhering to the upper surface and the lower surface of the lead frame.

However, when the thickness of the suspending lead 20 and the tie bar 30 is as large as the thickness of the lead frame, the suspending lead 20 and the tie bar 30 hinder or stop a flow of the resin. Consequently, in the multi-faced lead frame ML for a semiconductor light emitting device, there is a site which has not been subjected to the molding of resin. The site which has not been filled with the resin has bubbles, which deteriorates the quality of the lead frame for a semiconductor light emitting device and consequently the quality of a semiconductor light emitting device. Therefore, when there are many sites having bubbles, the lead frame for a semiconductor light emitting device is discarded as a defective.

On the other hands, in the present embodiment, the thickness of the suspending lead 20 and the tie bar 30 is as small as the thickness t3 of the radiator 3 and the radiator 3a serving as the lower structure, for example. Thus, the resin flows through gaps between the suspending lead 20, the tie bar 30 and the mold while the resin-filled is being injected. Thereby, the flowing of the resin is not hindered or stopped. Consequently, in the multi-faced lead frame ML for a semiconductor light emitting device according to the present embodiment, the resin-filled having no bubble can be shaped into a lead frame, which can enhance the quality of the lead frame for a semiconductor light emitting device. Further, defectives are eliminated, and thus a manufacture yield increases and consequently cost for manufacturing the lead frame for a semiconductor light emitting device can be lowered. Additionally, when the suspending lead 20 and the tie bar 30 are cut by a cutting blade to obtain unit frame thereof, a load on the cutting blade during the cutting is reduced since the thickness is small, thereby extending a life of the cutting blade. As described above, the resin-filled having a high light reflectivity is injected in a manner where the resin can be bubble-free, thereby improving the light reflectivity. For example, when bubbles are present on the surface of the resin-filled 4, a concave portion is formed on the surface of the resin-filled 4 and a light incident into the concave portion does not reflect in a desired direction. Therefore, less lights exit from the semiconductor light emitting device. However, since the resin-filled surface of with no bubble is flat, the incident light reflects in a desired direction. Thereby, a reflected light can be efficiently emitted from the light emitting device.

Although the suspending lead 20 and the tie bar 30 having the same thickness as that of the radiator are provided on the lower surface (the surface of the lower structure) of the lead frame in the present embodiment, the suspending lead 20 and the tie bar 30 having the same thickness as that of the upper structure may be provided on the upper surface (the surface of the upper structure) of the lead frame.

Fourth Embodiment

Next, a fourth embodiment of the present invention will be described with reference to FIGS. 13, 14, 15 and 16. In the present embodiment, descriptions for the points similar to those in the above embodiments will not be repeated.

Figure 16:
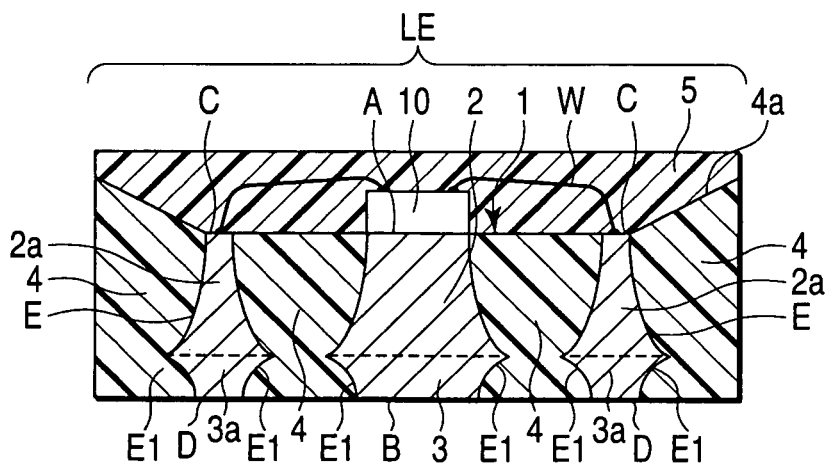
FIG. 16 is a cross-section view along XVI-XVI line of FIG. 13 showing the semiconductor light emitting device manufactured using the lead frame according to the fourth embodiment of the present invention.

A lead frame 1 being a metal portion of a resin-molded lead frame is formed by photoetching a base material having a metallic thin plate shape from both the surface and the lower surface. In other words, as shown in FIGS. 14 and 16, the lead frame 1 is configured with an upper structure pattern having a thickness t2 on the upper surface side and a lower structure pattern having a thickness t3 on the lower surface side, and the upper structure and the lower structure are integrated with each other. The patterns of the upper structure and the lower structure are formed by photoetching (half-etching described above) the base material having a thickness t1 in a metallic plate shape from both surfaces.

The upper structure pattern having the thickness t2 of the lead frame 1 comprises a pad part 2 and one or plural lead parts 2a separated therefrom and adjacent thereto at a predetermined interval. The lower structure pattern having the thickness t3 comprises a radiator 3 integrated with the pad part 2 on the lower surface and a radiator 3a integrated with the lead part 2a on the lower surface. In FIG. 16, W denotes one example of a wire. The wire is provided between a light emitting diode 10 mounted on a chip mounting upper surface A of the pad part 2 and an electric connection area C of the lead part 2a by wire bonding.

As shown in FIGS. 13, 14 and 16, the lead frame according to the present embodiment comprises one or plural pad parts 2 in the upper structure having the thickness t2 formed for mounting the LED chip 10 thereon, and the radiator 3 in the lower structure having the thickness t3 integrated with the pad part 2. The pad part 2 in the upper structure has the chip mounting upper surface A. The radiator 3 (heat radiating plate) in the lower structure integrated with the lower surface of the pad part 2 has a radiating lower surface B. As shown in FIG. 14, in a semiconductor light emitting device LE according to the present embodiment, the relationship between an area S1 of the LED chip mounting upper surface A of the pad part 2 in the lead frame 1 and an area S2 of the radiating lower surface B of the radiator 3 opposite to the chip mounting upper surface A is represented by 0<S1<S2. In other words, the area of the radiating lower surface B is set to be larger than the area of the chip mounting upper surface A. For example, the pad part 2 having a smaller area (the area in the plan view of FIG. 13) than the radiator 3 projects from the bed-shaped radiator 3.

As described above, the surface (upper surface) of the pad part 2 is the chip mounting upper surface A having the area S1 for mounting the LED chip 10 thereon, the outer surface of the radiator 3 on the lower surface opposite to the pad part 2 in the upper structure is the radiating lower surface B having the area S2. The radiating lower surface B is formed to be exposed from the resin 4 so that the radiating lower surface B radiates drive heat occurring from a body of the LED chip 10 or heat under an ambient environmental condition of the LED chip 10, thereby radiating the heat from the lower surface of the pad part 2 to the outside such that the heat is not accumulated in the IC chip 10.

Figure 15:
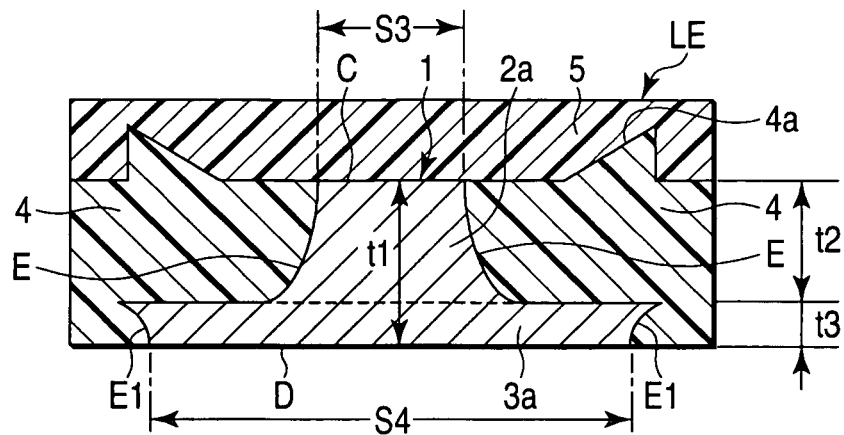
FIG. 15 is a cross-section view along XV-XV line of FIG. 13 showing the semiconductor light emitting device manufactured using the lead frame according to the fourth embodiment of the present invention.

As shown in FIGS. 13, 15 and 16, the lead frame 1 according to the present embodiment comprises one or plural structures in which the lead part 2a having the thickness t2 in the upper structure and the radiator 3a having the thickness t3 in the lower structure are integrated, to be separated from the structure having the pad part 2, similar to FIG. 14. The surface of the lead part 2a is as high as the chip mounting upper surface A of the pad part 2. The surface of the lead part 2a is the electric connection area C having a wire bonding area to which the wire for connecting to the LED chip 10 is boded and an area to which a connection electrode formed in the LED chip 10 is chip-bonded by soldering. The electric connection area C is subjected to silver plating or the like in order to improve connectivity when the electric connection between the LED chip 10 and the lead 2 is made by wire bonding, chip bonding or the like, and has an area S3.

The surface (lower surface) of the radiator 3a is opposite to the electric connection area C and serves as the radiating lower surface D (heat radiating plate) as high as the radiating lower surface B of the pad part 2. The radiating lower surface D has an area S4.

As shown in FIG. 16, the chip mounting upper surface A of the pad part 2 and the surface of the electric connection area C of the lead part 2a are made of the same plate-shaped base material and thus are at the same plane and at the same height. The electric connection area C of the lead part 2a is connected with the wire W by wire bonding or a chip by chip bonding, and is electrically connected to the LED chip 10 to be mounted on the chip mounting upper surface A of the pad part 2.

There are formed stepped parts or tapered parts E on the side surfaces of the pad part 2 in the upper structure, which spreads in a direction from the surface (the surface including the chip mounting upper surface A and the electric connection area C) of the upper structure toward the lower surface (the surface including the radiating lower surface B and the radiating lower surface D) of the radiator 3 in the lower structure. The stepped parts or tapered parts E hold the resin-filled 4 during the resin molding. On the other hand, there is formed a tapered parts E1 on the side surface of the radiator 3 (heat radiating plate) in the lower structure, which are reversely tapered to the tapered parts E and spread in a direction from the lower surface of the lower structure toward the surface of the upper structure. Thus, as described above, the resin-filled 4 can be held during the molding.

As shown in FIG. 15, the lead part 2a of the lead frame 1 has the electric connection area C in plane with the chip mounting upper surface A of the pad part 2. On the other hand, the radiator 3a in the lower structure which is integral with the lead part 2a has the radiating lower surface D in plane with the radiating lower surface B of the radiator 3. The relationship between the area S3 of the electric connection area C and the area S4 of the radiating lower surface D is represented by 0<S3<S4. In other words, the area of the radiating lower surface D is set to be larger than the area of the electric connection area C to be wire-bonded. For example, the lead part 2a having a smaller area (the area in the plan view of FIG. 13) than the radiator 3 projects from the bed-shaped radiator 3a.

The stepped parts or tapered parts E which spread in a direction from the electric connection area C toward the radiating lower surface D is formed on the side surfaces of the lead part 2a in the upper structure between the electric connection area C and the radiating lower surface D, and hold the resin-filled 4 so as not to come off in a direction from the frame surface toward the lower surface during the molding. On the other hand, the tapered parts E1 which spread in a direction from the radiating lower surface D toward the electric connection are C are formed on the side surfaces of the radiator 3 (heat radiating plate) in the lower structure, and hold the resin-filled 4 so as not to come off in a direction from the frame lower surface toward the surface during the molding.

In the lead frame 1 having the above structure, the tapered parts E in the upper structure are tapered in a direction, for example, from the upper surface toward the lower surface, and the tapered parts E1 in the lower structure are tapered in a direction, for example, from the lower surface toward the upper surface. In other words, the upper structure and the lower structure are reversely tapered.

Thus, as described above, the resin-filled 4 at each of the sites immediately between the pad part 2 and radiator 3 and between the lead part 2a and radiator 3a has a hourglass site between the upper surface (surface of the upper structure) and the lower surface (surface of the lower structure), for example, as shown in FIG. 16, the cross-section shape is an hourglass shape, for example. The lead frame 1 holds the resin-filled 4 at the hourglass portion of the resin 4. Thus, the resin 4 can be prevented from coming off the lead frame 1.

The relationship between the area S1 of the LED chip mounting upper surface A of the pad part 2 and the area S2 of the radiating lower surface B opposite to the chip mounting upper surface A is set at 0<S1<S2, and the relationship between the area S3 of the electric connection area C and the area S4 of the radiating lower surface D is set at 0<S3<S4. The radiating lower surface B is wider in area than the chip mounting upper surface A, and the radiating lower surface D is wider in area than the electric connection area C and these surfaces are exposed from the resin 4. Therefore, a high radiating property can be obtained on the lower surface of the lead frame.

The method for forming the lead frame 1 is as follows. Photoresist is applied on both surfaces of a metal plate for the lead frame, and pattern exposure and development processing are performed on the photoresist to form a resist pattern. Thereafter, an etchant as ferric chloride is used to perform so-called photoetching (half-etching described above) for etching a metal plate site exposed from the resist patterns on both surfaces. The lead frame 1 is formed in this way. Thus, the lead frame 1 comprises the pad part 2 configured to have an LED device mounted thereon and the lead part 2a separated and insulated from the pad part 2.

(Method of Manufacturing Lead Frame)

Next, a method for manufacturing a resin-molded lead frame according to the present embodiment will be described.

The lead frame according to the present embodiment is obtained by the method similar to that according to the second embodiment. In other words, photoetching is performed on a metal material from both surfaces. Thus, there is formed the lead frame configured with the pad part 2 and the radiator 3 for which the relationship between the area S1 of the mounting upper surface A and the area S2 of the radiating lower surface B is represented by S1<S2, and the lead part 2a and the radiator 3a for which the relationship between the area S3 of the electric connection area C and the area S4 of the radiating lower surface D is represented by S3<S4.

In the lead frame according to the present embodiment, Ni underlying plating is performed on the electric connection area C of the lead part 2a after the etching, and silver plating, gold plating or palladium plating is performed thereon. The plating on the electric connection area C may be performed after the step of filling the resin-filled 4 in the lead frame 1 for molding, which will be described later. In other words, there may be performed the processing of plating the electric connection area C exposed from the resin-filled 4.

Next, the molding using a mold is performed on the thus-formed lead frame 1 to shape the resin 4 as described later. Thus, the resin-filled lead frame is manufactured such that the chip mounting upper surface A and the radiating lower surface B, and the electric connection area C and the radiating lower surface D are exposed from the resin 4, respectively.

As shown in FIG. 17, a concave portion having a predetermined inner shape configured to house the lead frame 1 (such as a concave portion having the same depth t1 as the thickness t1 of the lead frame material) is previously formed in the mold used in the molding. The mold is configured with a pair of molds of a plate-shaped upper mold 40 as a lid and a lower mold 41. An injection port 42 configured to inject the melt resin 4 and a concave part 43 capable of mounting the lead frame 1 (multi-faced lead frame ML) as an inner space are formed in the lower mold 41. In the present embodiment, a concave part 40a for a light reflecting ring, which is designed to form a light reflecting ring 4a described later on the top of the resin-filled 4, is formed as an inner space in the upper mold 40.

In the resin molding procedure, the lead frame 1 is first mounted in the concave part 43 of the lower mold 41. Next, the upper mold 40 covers and fastens the lower mold 41.

Then, the thermally-melt resin 4 is injected inside the inner space between the concave part 43 and the concave part 40a for a light reflecting ring from the injection port 42. Thus, there is obtained the resin-filled lead frame in which the resin 4 is molded in the mounted lead frame 1. After the resin 4 is molded, the upper mold 40 is removed and the resin-filled lead frame is taken out from the lower mold 41. Thereby, the resin 4 is filled between the pad part 2 and the lead part 2a in the lead frame 1. In other words, there is formed the resin-filled lead frame in which the chip mounting upper surface A and the radiating lower surface B, and the electric connection area C and the radiating lower surface D are exposed to the outside from the resin 4. The resin-filled lead frame is filled with the resin 4 in the thickness direction of the lead frame 1 from the height of the mounting upper surface A and the electric connection area C up to the height of the radiating lower surface B and the radiating lower surface D opposite thereto.

As shown in FIG. 13, the light reflecting ring 4a is formed and projects from the resin-filled 4 to be integrated with the resin-filled 4 during the molding. The light reflecting ring 4a is formed in a circular shape in a plan view between and outside the pad part 2 and the lead part 2a on the resin-filled lead frame. The center of the circle is positioned near the light emitting part (LED) of the LED chip 10. Then, the cross-part shape of the circle is formed so that the inner periphery surface opposite to the light emitting part of the LED chip 10 is tilted at 30 degrees to 85 degrees relative to the surface formed between the chip mounting upper surface A and the electric connection area C. The shape of the tilted inner periphery surface of the light reflecting ring 4a may be part of conic surface, elliptic cone surface, sphere or paraboloidal surface such that a light can be efficiently reflected. The tilt angle of the side surface may be appropriately set such that a light can be efficiently reflected. The shape of the light reflecting ring 4a in a plan view is not limited to circular, and may be multi-crescent shape whose circular center is near the light emitting part, part of a circular, or oval shape with the center at the light emitting part of the LED chip 10. If the light emitting part is near the center of the circle, the center of the circle as the light reflecting ring 4a may be slightly offset from the light emitting part.

As described above, the concave part 40a for a light reflecting ring is formed in the upper mold 40, and the resin-filled 4 injected during the molding is shaped into the light reflecting ring 4a. Thus, the light reflecting ring 4a is configured to be integrated with the resin 4 ranging from the height of the chip mounting upper surface A and the electric connection area C to the height of the radiating lower surface B and the radiating lower surface D, and is formed to project from the resin 4. In other words, the light reflecting ring 4a and the resin 4 are integrated with each other and no interface is present therebetween. Therefore, the light reflecting ring 4a and the resin 4 are strongly connected together, which causes strong adhesion. Since no interface is present between the light reflecting ring 4a and the resin 4, water vapor will not diffuse in the interface, and the light reflecting ring 4a and the resin 4 will not be easily separated from each other. Thus, the light reflecting ring 4a having high connection reliability can be obtained. Furthermore, since the light reflecting ring 4a is formed at the same time with other parts filled with the resin-filled 4, the resin molding is required one time.

During the molding, the thermally-melt resin is injected into the mold. Thus, if the light reflecting ring 4a is molded in another step after the resin 4 is shaped, the resin is heated several times, which causes deterioration due to the heat. However, in the method of manufacturing lead frame according to the present embodiment, it is not necessary to repeat the molding several times. In other words, the lead frame can be formed by molding once. Thus, it is possible to prevent the deterioration due to the heat history of the resin-filled 4 which occurs by the heat added to the resin 4 whenever the molding is performed. Thus, the deterioration, of the light reflecting property due to the thermal deterioration of the resin 4 can be prevented and the light reflectivity can be kept high.

It is desirable to use white resin having a high light reflecting efficiency for the resin-filled 4 and the light reflecting ring 4a used for the molding. The resin 4 and the light reflecting ring 4a desirably have heat resistance, light resistance, heat conductivity, and high light diffusing property. Therefore, the resin 4 and the light reflecting ring 4a desirably employ an organic polymer material such as epoxy resin, modified epoxy resin, silsesquioxane based rein, silicon resin, acrylic resin, polycarbonate resin, aromatic polyester resin (unsaturated polyester resin), polyamide based resin, polyphthalamide (PPA), liquid crystal polymer (LCP) or cycloolefin based rein, and may employ one resin or a mixture of multiple resins.

A light diffusing resin in which an additive such as a powdery substance is mixed into the one resin or mixture of multiple resins is desirably used for the resin 4 and the light reflecting ring 4a. The additive to be added to the resin 4 and the light reflecting ring 4a may be particulate matters including $SiO_2$, $TiO_2$, $Al_2O_3$, zirconium oxide, lead oxide, white powder such as ceramic material, or a mixture thereof. The mixing ratio of the additive to the main resin can be appropriately set. For example, the ratio is 1% to 20% or more. The resin-filled 4 has an advantage that the light diffusing property can be enhanced by the additive. Additionally, the refraction index n of the resin-filled 4 can be set at 2 or more by the additive. Thus, the refraction index can be set to be larger than the refraction index of a transparent resin 5 to be formed on the resin-filled 4 later. The difference in refraction index can cause a high reflectivity at the interface between the resin-filled 4 and the transparent resin 5.

A suspending lead 20 shown in FIG. 13 is designed to prevent the pad part 2 and the lead part 2a from coming off the metal material after the etching processing or after the punching using a press mold, and is formed for connecting and holding the pad part 2 and the lead part 2a to and on the metal material for a necessary period of time. Thus, the suspending lead 20 is cut after the resin-filled 4 is formed, thereby obtaining the resin-filled lead frame. In the cross-section views, the suspending lead 20 is not illustrated. The connecting part between the suspending lead 20 and the metal material is cut to separate the resin-filled lead frame. The suspending lead 20 is cut after the LED chip 10 is mounted on the resin-filled lead frame or after the transparent resin 5 is molded, but may be appropriately cut.

Through the above processes, as shown in FIGS. 13, 14, 15 and 16, there is obtained the resin-filled lead frame which comprises, in the same plane, one or plural pad parts 2 for having the LED chip 10 mounted thereon, and the lead part 2a having the electric connection area C configured to make electric connection with the LED chip 10. There is manufactured the semiconductor light emitting device LE in which the LED chip 10 is mounted on the thus-obtained resin-filled lead frame. The transparent resin 5 which covers the LED chip 10 and the wire W bonded to the electric connection area C and contacts the inner periphery surface of the light reflecting ring 4a is formed in a layered-shape or domed-shape on the chip mounting upper surface A of the pad part 2 and on the electric connection area C of the lead part 2a, after mounting the LED chip 10 on the resin-filled lead frame. The transparent resin 5 is formed in a thickness that can cover the LED chip 10 and the wire W. A resin which is excellent in transparency such as acrylic resin is used as the transparent resin 5. Thus, when the LED chip 10 emits a light while being embedded inside the layer of the transparent resin 5, a high optical gain can be obtained for discharging the light emitted from the LED chip 10 to the outside from the transparent resin 5.

In the resin-filled lead frame, the relationship between the area S1 of the chip mounting upper surface A of the pad part 2 and the area S2 of the radiating lower surface B is set at S1<S2, and the relationship between the area S3 of the electric connection area C to be wire-bonded to the lead part 2a and the area S4 of the radiating lower surface D is set at S3<S4. Thus, the radiating site can be set to be large and the semiconductor light emitting device LE which is excellent in a radiating property can be obtained.

There are provided the stepped parts or tapered parts E which spread in a direction toward the radiating lower surfaces B and D on the side surfaces of the pad part 2 and the lead part 2a between the chip mounting upper surface A and the radiating lower surface B and between the electric connection area C and the radiating lower surface D. There is provided the tapered parts E1 which spread toward the chip mounting upper surface A and the radiating lower surface B on the side surfaces of the radiators 3 and 3a between the chip mounting upper surface A and the radiating lower surface B and between the electric connection area C and the radiating lower surface D. Thus, when the resin-filled 4 is molded in a melt state and after the resin-filled is molded, the resin 4 is held by the stepped parts or tapered parts E and the tapered parts E1, and the contact area between the resin 4 and the lead frame increases. Therefore, the resin 4 and the lead frame are strongly fixed to each other, thereby preventing the lead frame from coming off the resin 4 or the resin 4 from coming off the lead frame. The lead frame 1 can be formed by a typical photoetching method at low cost, thereby obtaining a resin-filled lead frame at low cost.

The surface of the light reflecting ring 4a integrated with the resin-filled is tilted at 30 degrees to 85 degrees relative to the surface formed between the chip mounting upper surface A and the electric connection area C, and projects from the resin-filled. Thus, the contact area between the resin-filled 4 or the light reflecting ring 4a and the transparent resin layer 5 is larger than a case where the light reflecting ring 4a is not present and the resin-filled 4 is plane. With this arrangement, the light reflecting ring 4a and the transparent resin layer 5 are strongly fixed to each other, thereby preventing the transparent resin layer 5 from releasing.

Since the refraction index n of the resin-filled 4 can be set at 2 or more by the additive, the relationship between the optical refraction index n1 of the resin-filled 4 and the optical refraction index n2 of the transparent resin 5 can be set at n1>n2. The difference in refraction index causes a high reflectivity at the interface between the resin-filled 4 and the transparent resin 5. The larger the difference in refraction index is, the higher the reflection can be exhibited. The refraction index of a typical resin is generally 2 or less, and there is a limitation for increasing the difference in refraction index only by the resin. However, the resin-filled 4 according to the present embodiment is added with, as an additive, +particulate such as $SiO_2$, $TiO_2$, $Al_2O_3$, zirconium oxide, ceramic material or a mixture thereof. At this time, the additive is added to the main resin at the mixing ratio of 1% to 20%, or more, for example, and thereby the refraction index of the resin-filled 4 can be set at 2 or more. Therefore, the difference in refraction index between the resin-filled 4 and the transparent resin 5 can be increased and a high reflectivity can be obtained at the interface between the resin-filled 4 and the transparent resin 5.

Effects due to the resin-filled 4 and the light reflecting ring 4a having a reflectivity will be described below.

Figure 18:
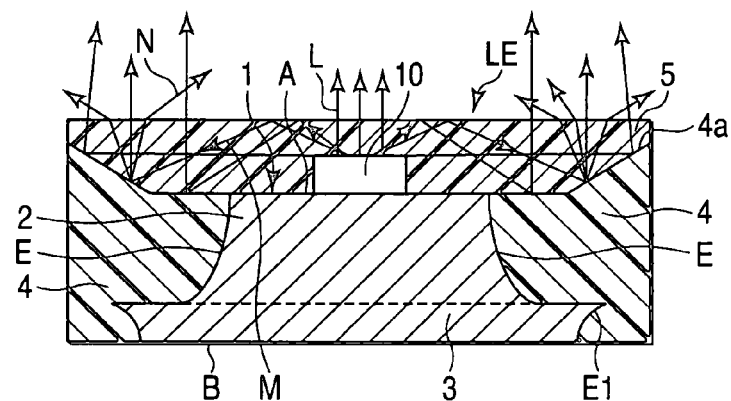
FIG. 18 is a schematic cross-section view for explaining a function of a light reflecting ring according to the fourth embodiment of the present invention.

As shown in FIG. 18, a light L emitted from the LED chip 10 travels inside the transparent resin 5 and is discharged to the outside. However, part of the light emitted from the LED chip 10 reflects on the interface with the transparent resin 5 contacting the outside (reflected light M in FIG. 18). Thereafter, the reflected light M reaches the surface of the resin-filled 4 and the light reflecting ring 4a integrated with the resin-filled 4 and projecting from the resin-filled 4. At this time, when the resin-filled 4 and the light reflecting ring 4a have a high light reflectivity, the reflected light M can be reflected again on the surface of the resin-filled 4 and the light reflecting ring 4a (re-reflected light N in FIG. 18). In other words, the re-reflected light N can be discharged from the LED device.

The surface of the light reflecting ring 4a is tilted at 30 degrees to 85 degrees relative to the surface formed between the chip mounting upper surface A and the electric connection area C so that a reflected light incident into the tilted surface of the light reflecting ring 4a can be efficiently re-reflected. Further, even when the light emitted from the LED chip 10 is directly incident into the tilted surface of the light reflecting ring 4a, the incident light can be efficiently reflected to the outside.

In this way, the resin-filled 4 has a high reflectivity so that the light emitted from the LED chip 10 can be efficiently discharged to the outside. When metal plating is performed on the chip mounting upper surface A of the LED chip 10 and the electric connection area C, the reflected light M can be the re-reflected light N on the plated surface and thus the light emitted from the LED chip 10 can be efficiently used. A ceramic ink which is excellent in light reflectivity is preferably used to coat the surface of the resin-filled 4 and thus the light emitted from the LED chip 10 can be efficiently used.

In the present embodiment, as shown in FIG. 15, the transparent resin 5 is formed to cover the entire light reflecting ring 4a, which covers the LED chip 10 and the wire W bonded to the electric connection area C and assumes the site contacting the inner periphery surface of the reflecting ring 4a as the light reflecting surface. However, depending on a specification of the semiconductor light emitting device, the entire light reflecting ring 4a does not need to be coated with the transparent resin. In other words, the transparent resin 5 covers part of or all the inner periphery surface of the light reflecting ring 4a such that the light reflecting surface where the transparent resin 5 and the inner periphery surface of the light reflecting ring 4a contact each other has a desired reflectivity. At this time, the outside of the light reflecting ring 4a may be exposed from the transparent resin 5.

Fifth Embodiment

Next, a lead frame for a semiconductor light emitting device according to a fifth embodiment of the present invention will be described with reference to FIGS. 19, 20A and 20B.

Figure 19:
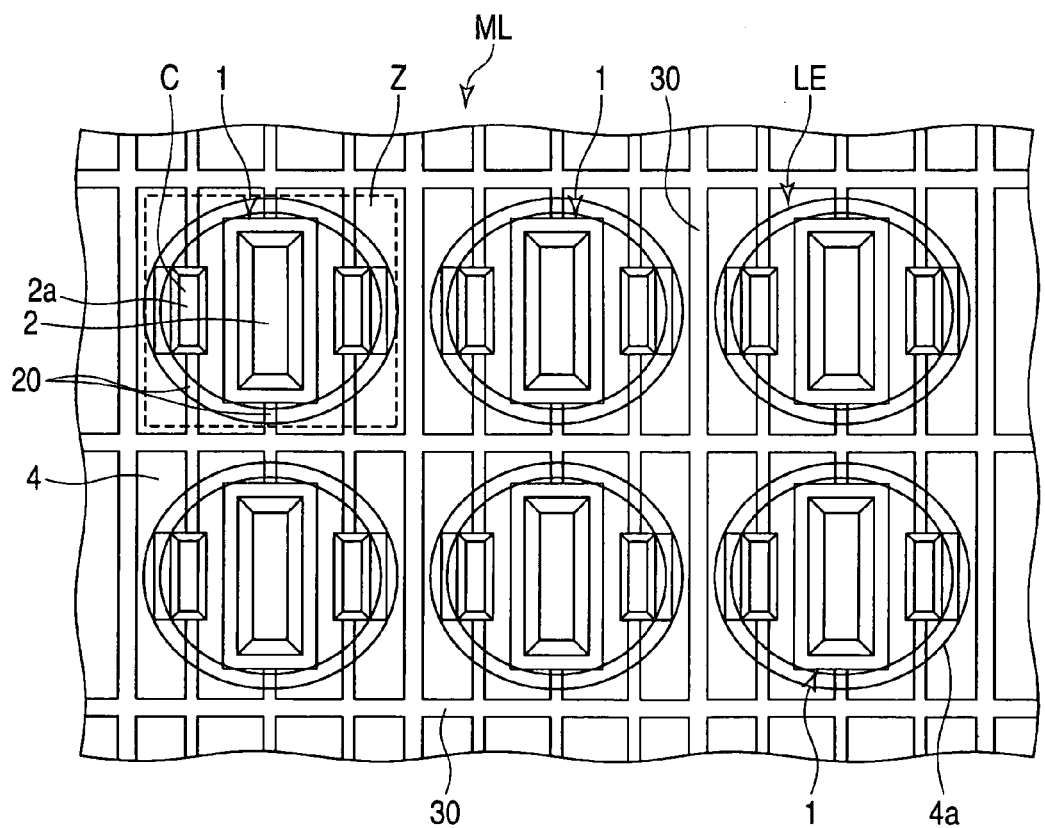
FIG. 19 is an upper view of a multi-faced lead frame (multiple unit lead frames) connected via a tie bar according to a fifth embodiment of the present invention.

As shown in FIG. 19, in a resin-filled lead frame according to the present embodiment, a pad part 2 and a lead part 2a in a lead frame 1 is assumed as unit frame indicated by a dotted line Z. The resin-filled lead frame is manufactured with a branch-shaped or belt-shaped metal material by using a multi-faced lead frame ML in which multiple unit frames are arranged side by side in the longitudinal and lateral directions.

As shown in FIG. 19, a lattice-shaped frame called tie bar 30 is formed, for example. The tie bar 30 can prevent the lead frame 1 from coming off the metal material after etching. The unit frame is formed to be connected to the tie bar 30 within an opening area of the tie bar 30 serving as the frame. In the present embodiment, the connecting between the unit frame and the tie bar 30 is made via a suspending lead 20 branched from the tie bar 30. However, depending on a specification, the unit frame and the tie bar 30 may be directly connected instead of forming the suspending lead 20.

The tie bar 30 and the suspending lead 20 are formed when the pad part 2 and the lead part 2a are formed in a similar method to the method for forming the pad part 2 and the lead part 2a, while the pad part 2 and the lead part 2a are formed through etching. In other words, the tie bar 30 and the suspending lead 20 are formed by forming photoresist also on the metal material site where the tie bar 30 and the suspending lead 20 are formed. The suspending lead 20 or the tie bar 30 is cut so that each unit frame is separated from the metal material.

As shown in FIG. 20A, the pad part 2 and the lead part 2a in an upper structure of each unit frame formed in the multi-faced lead frame ML are formed on a lower structure having a thickness t3. Thus, the height from the lower surface of the lower structure up to the upper surface of the pad part 2 and the lead part 2a is t1 which is identical to the thickness of the metal material. In the present embodiment, the thickness of the suspending lead 20 and the tie bar 30 is set at the thickness t3 of the lower structure smaller than the thickness t1 of the metal material, and has the same thickness as the radiator 3 and the radiator 3a. In other words, the height of the upper surface of the suspending lead 20 and the tie bar 30 relative to the lower surface of the lower structure is set at t3. To form the suspending lead 20 and the tie bar 30 having a small thickness, the suspending lead 20 and the tie bar 30 may be formed by performing half-etching on the metal material sites to be the suspending lead 20 and the tie bar 30 when the metal material is etched to form the pad part 2 and the lead part 2a. In other words, photoresist for forming the suspending lead 20 and photoresist for forming the tie bar 30 are formed on one surface (such as the surface at the radiator side) of the metal material site on which the suspending lead 20 and the tie bar 30 are to be formed. Then, the etching for forming the pad part 2 and the lead part 2a is performed from both sides of the metal material as described above. When the suspending lead 20 and the tie bar 30 whose thickness is made smaller by the half-etching are formed on the surface (the LED chip mounting upper surface A, the electric connection area), the photoresist for forming the suspending lead 20 and the photoresist for forming the tie bar 30 are formed on the surface (the LED chip mounting upper surface A, the electric connection area).

As shown in FIGS. 19 and 20A, the multi-faced lead frame ML having a flat plate shape in which the unit lead frames 1 are multi-faced and manufactured by photoetching is mounted between an upper mold 40 and a lower mold 41 for manufacturing a resin-filled lead frame 1b, as shown in FIG. 17. Thereafter, a resin 4 is injected to fill and to be shaped in an inner space between a concave part 43 within the mold and a concave part 40 for a light reflecting ring. Thus, as shown in FIG. 20B, the resin 4 is filled so that the chip mounting upper surface A and the radiating lower surface B, and the electric connection area C and the radiating lower surface D are exposed, respectively, thereby forming the multi-faced lead frame ML filled with the resin-filled 4.

Thereafter, the multi-faced lead frame ML is cut to obtain a separated unit frame. The multi-faced lead frame ML may be cut after the LED chip is mounted or after a transparent resin is formed without being limited to after the resin is molded, and may be appropriately cut.

When the resin molding is performed on the multi-faced lead frame ML, the multi-faced lead frame ML is arranged inside the lower mold 41 having the concave part 43 where the multi-faced lead frame ML is to be arranged, and inside the upper mold 40 having the concave part 40a for a light reflecting ring. Then, the resin-filled 4 is injected into a space between the upper mold 40 and the lower mold 41 through a resin injection port 42 formed in the lower mold 41. When the resin-filled 4 is injected into the molds, the resin sequentially flows from unit frame near the resin injection port 42, among the multi-faced lead frames ML, to unit frame distant from the injection port, and is molded.

The depth of the concave part 43 of the lower mold 41 (the height of the inner space) is formed to be the same as the thickness of the lead frame such that the resin-filled 4 does not adhere to the surface and the lower surface of the multi-faced lead frame ML during the resin molding. Thus, when the multi-faced lead frame ML is mounted inside the mold, the surface of the multi-faced lead frame ML is tightly applied on the surface of the upper mold 40 and the lower surface thereof is tightly applied on the surface of the lower mold 41. Thereby, when the resin is injected into the concave portion (inner space), the resin is prevented from adhering to the surface and the lower surface of the multi-faced lead frame ML, and the surface (the LED chip mounting upper surface A, the electric connection area) and the lower surface (radiating lower surface) of the multi-faced lead frame ML are exposed from the resin-filled 4, respectively.

When the thickness of the suspending lead 20 and the tie bar 30 is as large as the thickness of the lead frame, the suspending lead 20 and the tie bar 30 hinder or stop a flow of the resin, which causes a site which is not resin-molded in the multi-faced lead frame ML. Consequently, the site which is not filled with the resin 4 is a site having bubbles, the quality of the resin-filled lead frame 1b and thus the quality of the semiconductor light emitting device LE are deteriorated, and the lead frame or device may be discarded as defective in an extreme case.

For addressing the case, in the present embodiment, the thickness of the suspending lead 20 and the tie bar 30 is reduced to be equal to the thickness t3 of the radiator 3 and the radiator 3a in lower structure. Thus, the resin flows in gaps formed between the suspending lead 20, the tie bar 30 and the mold while the resin-filled 4 is injected. Thereby, the flowing of the resin is not hindered or stopped. Consequently, the molding can be performed on the multi-faced lead frame ML without bubbles in the resin-filled 4, and the quality of the resin-filled lead frame 1b can be enhanced. Further, since no defective is present, a manufacturing yield can be increased and thus manufacturing cost of the resin-filled lead frame 1b can be lowered. When the suspending lead 20 and the tie bar 30 are cut by a cutting blade, a load on the cutting blade during the cutting can be reduced due to the small thickness, thereby extending a life of the cutting blade. Furthermore, the resin-filled having a high reflectivity as described above is injected in a manner where the resin can be bubble-free, thereby improving a light reflectivity. For example, when bubbles are present on the surface of the resin-filled containing the light reflecting ring 4a, a concave portion is formed on the surface of the resin-filled and a light incident into the concave portion does not reflect in a desired direction. Thus, less light are discharged from the semiconductor light emitting device. However, the resin-filled surface with no bubble is flat, and thus an incident light reflects in a desired direction. Therefore, a reflected light can be efficiently emitted from the light emitting device.

Although, in the present embodiment, the suspending lead frame 20 and the tie bar 30 having the same thickness as that of the lower structure are provided on the lower structure side (the lower surface side) of the lead frame, the suspending lead 20 and the tie bar 30 having the same thickness as that of the upper structure may be provided on the upper structure side (the surface side) of the lead frame.

DESCRIPTION OF REFERENCE NUMERALS

1: lead frame, 1b: resin-filled lead frame, 2: pad part 2a: lead, 3: radiator, 3a: radiator, 4: (filling) resin, 4a: light reflecting ring, 5: transparent resin, 10: LED chip (light emitting diode), 20: suspending lead, 30: tie bar, 40: upper mold, 40a: concave part for light reflecting ring, 41: lower mold, 42: injection port, 43: concave part, A: chip mounting surface, B: radiating lower surface, C: electric connection area, D: radiating lower surface, E: stepped part or tapered part, E1: tapered part (or chamfered part), L: LED light beam, LE: semiconductor light emitting device, M: reflected light, ML: multi-faced lead frame, N: re-reflected light, W: wire, Z: unit frame

What is claimed is:
1. A lead frame comprising: on a same plane,
a pad part including an LED chip mounting upper surface on which an LED chip is to be mounted; and
a lead part having a thickness that is the same as that of the pad part and including an electric connection area in which an electric connection with the LED chip is made, the electric connection area being in plane with the LED chip mounting upper surface, wherein
an area of the mounting upper surface of the pad part is less than an area of a radiating lower surface opposite to the mounting upper surface,
the pad part is formed of a first upper structure including the mounting upper surface and a first lower structure integrated with the first upper structure and including the radiating lower surface,
whole side surfaces of the first upper structure are provided with tapered parts, which spread in a direction from the mounting upper surface toward the radiating lower surface and hold a resin filled during molding, the resin having the thickness of the lead part,
whole side surfaces of the first lower structure are provided with tapered parts, which spread in a direction from the radiating lower surface toward the mounting upper surface and hold the resin filled during molding, and
shapes of the whole side surfaces of the first upper structure and shapes of the whole side surfaces of the first lower structure are curved.
2. The lead frame according to claim 1, wherein
an area of the electric connection area of the lead part is less than an area of a radiating lower surface of the lead part opposite to the electric connection area, the radiating lower surface of the lead part being in plane with the radiating lower surface of the pad part, the lead part is formed of a second upper structure including the electric connection area and a second lower structure integrated with the second upper structure and including the radiating lower surface, whole side surfaces of the second upper structure are provided with tapered parts, which spread in a direction from the electric connection area towards the radiating lower surface and hold the resin filled during molding, and whole side surfaces of the second lower structure are provided with tapered parts, which spread in a direction from the radiating lower surface toward the electric connection area and hold the resin filled during molding.

3. The lead frame according to claim 2, wherein shapes of the whole side surfaces of the second upper structure and shapes of the whole side surfaces of the second lower structure are bent or curved.

4. The device according to claim 1, wherein the shapes of the whole side surfaces of the first lower structure are curved in such a manner that slopes of the whole side surfaces of the first lower structure continuously changes and the shapes of the whole side surfaces of the first upper structure are curved in such a manner that slopes of the whole side surfaces of the first upper structure continuously changes.

5. A semiconductor light emitting device including a lead frame comprising: in a same plane,
a pad part including an LED chip mounting upper surface on which an IC chip such as an LED chip is mounted; and
a lead part having a thickness that is the same as that of the pad part and including an electric connection area in which an electric connection with the LED chip is made, the electric connection area being in plane with the LED chip mounting upper surface,
the lead frame molded with a first resin in a thickness direction from the mounting upper surface toward a radiating lower surface opposite to the mounting upper surface, and a transparent resin covering the mounting upper surface of the pad part while including the LED chip and the electric connection area, the first resin having the thickness of the lead part, wherein
an area of the mounting upper surface of the pad part is less than an area of the radiating lower surface,
the pad is formed of a first upper structure including the mounting upper surface and a first lower structure integrated with the upper structure and including the radiating lower surface,
whole side surfaces of the first upper structure are provided with or tapered parts from the mounting upper surface toward the radiating lower surface,
whole side surfaces of the first lower structure are provided with tapered parts from the radiating lower surface toward the mounting upper surface,
the first resin is held in the tapered parts, and
shapes of the whole sides surfaces of the first upper structure and shapes of the whole side surfaces of the first lower structure are curved.

6. The device according to claim 5, wherein
an area of the electric connection area of the lead part is less than an area of a radiating lower surface of the lead part opposite to the electric connection area, the radiating lower surface of the lead part being in plane with the radiating lower surface of the pad part,
the lead part is formed of a second upper structure including the electric connection area and a second lower structure integrated with the second upper structure and including the radiating lower surface, whole side surfaces of the second upper structure are provided with tapered parts, which spread in a direction from the electric connection area toward the radiating lower surface and hold the first resin filled during molding, whole side surfaces of the second lower structure are provided with tapered parts, which spread in a direction from the radiating lower surface toward the electric connection area and hold the first resin filled during molding, and the first resin is held in the tapered parts.

7. The device according to claim 6, wherein shapes of the whole side surfaces of the second upper structure and shapes of the whole side surfaces of the second lower structure are curved.

8. The device according to claim 5, wherein an optical refraction index of the first resin is set to be greater than an optical refraction index of the transparent resin, and the first resin has a high reflectivity.

9. The device according to claim 5, wherein the first resin is added with a particulate for improving a reflecting property.

10. The device according to claim 5, wherein the shapes of the whole side surfaces of the first lower structure are curved in such a manner that slopes of the whole side surfaces of the first lower structure continuously changes and the shapes of the whole side surfaces of the first upper structure are curved in such a manner that slopes of the whole side surfaces of the first upper structure continuously changes.

11. A lead frame comprising:
structures in which an upper structure on the upper surface and a lower structure on the lower surface are integrated together, the structures separated from each other;
a resin formed between and outside the structures,
the upper structure including a pad part and a lead part separated from the pad part, the lead part having a thickness that is the same as that of the pad part,
the lower structure including a first radiator integrated with the pad part and a second radiator integrated with the lead part, the first radiator having a thickness that is the same as that of the second radiator,
an area of the upper surface of the pad part is less than an area of the lower surface of the first radiator,
an area of the upper surface of the lead part is less than an area of the lower surface of the second radiator, the upper surface of the lead part being in plane with the upper surface of the pad part, and the lower surface of the second radiator being in plane with the lower surface of the first radiator,
whole side surfaces of the each upper structure provided with tapered parts, which spread in a direction from the upper surface of the structures toward the lower surface thereof, and
whole side surfaces of the each lower structure provided with tapered parts which spread in a direction from the lower surface of the lead frame toward the upper surface thereof; and
a light reflecting ring formed on the upper surface and outside the pad part and the lead part, the light reflecting ring comprising an inner periphery surface tilted to the pad part, and the light reflecting ring integrally formed with the resin and projecting from the resin,
wherein shapes of the whole side surfaces of the each upper structure and shapes of the whole side surfaces of each lower structure are curved.

12. The lead frame according to claim 11, wherein a tilt angle of the inner periphery surface of the light reflecting ring relative to the upper surface of the pad part is between 30 degrees and 85 degrees.

13. The lead frame according to claim 11, wherein the resin is a light diffusing resin mixed with a powdery additive and has an optical refraction index of 2 or more.

14. The device according to claim 11, wherein the shapes of the whole side surfaces of the each lower structure are curved in such a manner that slopes of the whole side surfaces of the each lower structure continuously changes and the shapes of the whole side surfaces of the each upper structure are curved in such a manner that slopes of the whole side surfaces of the each upper structure continuously changes.

15. A semiconductor light emitting device comprising:
a lead frame including structures in which an upper structure on an upper surface and a lower structure on a lower surface are integrated, structures separated from one another;
a first resin which is formed between and outside the structures of the lead frame
the upper structure including a pad part, and a lead part separated from the pad part, the lead part having a thickness that is the same as that of the pad part,
the lower structure including a first radiator integrated with the pad part and a second radiator integrated with the lead part, the first radiator having a thickness that is the same as that of the second radiator,
whole side surfaces of the each upper structure provided with tapered parts which spread in a direction from the upper surface of the lead frame toward the lower surface thereof,
whole side surfaces of the each lower structure provided with tapered parts which spread in a direction from the lower surface of the lead frame toward the upper surface thereof; and
a light reflecting ring for light reflection on the upper surface and outside the pad part and the lead part, the light reflecting ring including an inner periphery surface tilted relative to the pad part, integrally formed with the first resin, and projecting from the first resin, wherein
an LED chip is mounted on the upper surface of the pad part,
an electrode of the LED chip is electrically connected to the lead part,
a transparent resin which covers the LED chip and contacts the inner periphery surface of the light reflecting ring is formed, and
shapes of the whole side surfaces of the each upper structure and shapes of the whole side surfaces of the each lower structure are curved.

16. The device according to claim 15, wherein:
an area of the upper surface of the pad part is less than an area of the lower surface of the first radiator, and
an area of the upper surface of the lead part is less than an area of the lower surface of the second radiator, the upper surface of the lead part being in plane with the upper surface of the pad part, and the lower surface of the second radiator being in plane with the lower surface of the first radiator.

17. The device according to claim 15, wherein the first resin is a light diffusing resin in which a powdery additive is mixed into a resin, and has an optical refraction index of 2 or more, which is higher than a refraction index of the transparent resin.

18. The device according to claim 15, wherein the shapes of the whole side surfaces of the each lower structure are curved in such a manner that slopes of the whole side surfaces of the each lower structure continuously changes and the shapes of the whole side surfaces of the each upper structure are curved in such a manner that slopes of the whole side surfaces of the each upper structure continuously changes.

* * * * *

UNITED STATES PATENT AND TRADEMARK OFFICE
CERTIFICATE OF CORRECTION

PATENT NO. : 8,841,692 B2  
APPLICATION NO. : 12/737678  
DATED : September 23, 2014  
INVENTOR(S) : Osamu Yoshioka et al.

Page 1 of 1

It is certified that error appears in the above-identified patent and that said Letters Patent is hereby corrected as shown below:

In the Claims

Column 35, Line 49, In Claim 5, after "with" delete "or".

Signed and Sealed this  
Seventh Day of April, 2015

Michelle K. Lee  
*Director of the United States Patent and Trademark Office*